United States Patent
Blasi et al.

(10) Patent No.: US 7,392,171 B2
(45) Date of Patent: Jun. 24, 2008

(54) TEST BENCH GENERATOR FOR INTEGRATED CIRCUITS, PARTICULARLY MEMORIES

(75) Inventors: Gianluca Blasi, Vimercate (IT); Reenee Tayal, Delhi (IN)

(73) Assignees: STMicroelectronics S.r.l., Agrate Brianza (IT); STMicroelectronics Limited, Noida (IN)

( * ) Notice: Subject to any disclaimer, the term of this patent is extended or adjusted under 35 U.S.C. 154(b) by 571 days.

(21) Appl. No.: 10/603,055

(22) Filed: Jun. 24, 2003

(65) Prior Publication Data

US 2004/0078178 A1 Apr. 22, 2004

(30) Foreign Application Priority Data

Jun. 25, 2002 (EP) .................................. 02425415

(51) Int. Cl.
G06F 17/50 (2006.01)
(52) U.S. Cl. ............................... 703/15; 702/117; 707/3
(58) Field of Classification Search .................... 703/15
See application file for complete search history.

(56) References Cited

U.S. PATENT DOCUMENTS

| 5,369,604 | A | * | 11/1994 | Ravindranath et al. ....... 702/119 |
| 5,903,475 | A |   | 5/1999  | Gupte et al. |
| 5,923,867 | A |   | 7/1999  | Hand |
| 6,353,904 | B1 | * | 3/2002  | Le .............................. 714/726 |
| 6,477,683 | B1 | * | 11/2002 | Killian et al. ................... 716/1 |
| 6,490,711 | B2 | * | 12/2002 | Buckley, Jr. ................... 716/5 |
| 6,513,143 | B1 | * | 1/2003  | Bloom et al. ................... 716/3 |
| 6,658,633 | B2 | * | 12/2003 | Devins et al. ................... 716/5 |
| 6,671,843 | B1 | * | 12/2003 | Kebichi et al. ............... 714/733 |
| 6,687,662 | B1 | * | 2/2004  | McNamara et al. ........... 703/14 |
| 6,904,397 | B1 | * | 6/2005  | Fields et al. ................... 703/14 |
| 6,975,976 | B1 | * | 12/2005 | Casavant et al. .............. 703/14 |
| 7,024,346 | B1 | * | 4/2006  | Allard ........................ 703/14 |

FOREIGN PATENT DOCUMENTS

WO    WO 02/01424    1/2002

OTHER PUBLICATIONS

Lin et al, "A Goal Tree Based High-Level Test Planning System for DSP Real Number Models", Proceedings of the International Test Conference, pp. 1000-1009, Oct. 18-23, 1998.*
Bollano et al, "The Virtual Intellectual Property Library: From Paradigm to Product", Proc. Of IP99 Conference, Santa Clara, Mar. 1999.*
Zarrineh et al, "Automatic Generation and Validation of Memory Test Models for High Performance Microprocessors", Proceedings of the 2001 International Conference on Computer Design, pp. 526-529, Sep. 23-26, 2001.*
European Search Report, EP 02425415, dated Feb. 7, 2003.

* cited by examiner

*Primary Examiner*—Paul L Rodriguez
*Assistant Examiner*—Mary C Jacob
(74) *Attorney, Agent, or Firm*—Gardere Wynne Sewell LLP

(57) ABSTRACT

A computer based test bench generator (1) for verifying integrated circuits specified by models in a Hardware Description Language includes a repository (10) storing a general set of self-checking tests applicable to the integrated circuits. A capability is provided for entering behavior data (21) of an integrated circuit model (20), and for entering configuration data (22) of the integrated circuit model. The generator automatically generates test benches (30) in the Hardware Description Language by making a selection and setup of suitable tests from the repository according to the specified integrated circuit model, configuration and behavior data.

20 Claims, 20 Drawing Sheets

```
TEMPLATE < library name > < model name >
    MEM_TYPE < SYNC/ASYNC >;
    NUM_OF_PORT <constant>;                    } 51
    TYPE PORT
        ....
    END TYPE BEGIN PORT < port name >
        IF WRITE
            READ AT PORT < port name >;    } 61
        DEFINE SIGNAL
            ....                             } 62
        END DEFINE
        FTYPE .....                          } 63      } 52
        BEGIN TTYPE
            ....                             } 64
        END TTYPE
        BEGIN < cycle name >
            ....                             } 65
        END < cycle name >
        BEGIN BEHAVIOR
            ....                             } 66
        END BEHAVIOR
    END PORT
END TEMPLATE
```

```
TEMPLATE < libray name > < model name >
    MEM_TYPE < SYNC/ASYNC >;
    NUM_OF_PORT <constant >;
    TYPE PORT
        ....
    END TYPE                                          } 51

BEGIN PORT < port name >
        IF WRITE
            READ AT PORT < port name >;              } 61

DEFINE SIGNAL
            ....
        END DEFINE                                    } 62

FTYPE .....                                   } 63

BEGIN TTYPE
            ....
        END TTYPE                                     } 64         } 52

BEGIN < cycle name >
            ....
        END < cycle name >                            } 65

BEGIN BEHAVIOR
            ....
        END BEHAVIOR                                  } 66
    END PORT
END TEMPLATE
```

FIG. 5

TEST BENCH GENERATOR FOR INTEGRATED CIRCUITS, PARTICULARLY MEMORIES

PRIORITY CLAIM

The present application claims priority from European Application for Patent No. 02425415.3 filed Jun. 25, 2002, the disclosure of which is hereby incorporated by reference.

BACKGROUND OF THE INVENTION

1. Technical Field of the Invention

The present invention relates to electronic design automation (EDA) and, more particularly, to a system and method for the automatic generation of test benches suitable for verifying integrated circuits, with particular reference to memories.

2. Description of Related Art

Exhaustive verification and testing is a major issue in the process of achieving quality custom integrated circuits and ASICs (Application Specific Integrated Circuits).

Despite the latest advances in verification technology, it is very hard and rare to obtain safe and robust ASICs which work correctly the first time they are manufactured, so that it is often necessary to review the design in several steps, each time a misbehavior is encountered.

Due the increasing complexity of ASICs and circuits in general and to the major effort required in testing and revising hardware components, exploitation of electronic design automation is today a mandatory choice.

Electronic design automation is a computer-based technology that provides designers with automated or semi-automated tools both for the designing and the verifying of custom circuit designs.

It is thus used for creating, analyzing and editing several kinds of electronic designs for the purpose of simulation, emulation, prototyping, execution or computing, and to develop further, complex systems which use a previously user-designed subsystem or component.

Typically, the end result of an EDA session is a modified and enhanced design that is an improvement over the original design, without departing from the original aim and scope of that initial design.

Since EDA is heavily based on software prototyping and simulation of integrated circuits, specific languages have been introduced to permit the specification of hardware through software. Such languages are usually referred to as Hardware Description Languages (HDL).

In fact, despite the latest advances in electronic designing which have helped significantly in reducing the design-to-product time scale, the complexity of today's ASICs is such that self-checking HDL test benches have fully replaced the simplistic vector-based methodologies used in the past.

Unfortunately, developing a self-checking test bench is a difficult and time consuming task: recent surveys show that this process can easily consume between 50% and 70% of the overall design schedule.

In other words, the so called verification problem is growing because both the design complexity and, in parallel, the required amount of stimuli required for a comprehensive circuit test, are growing.

A typical test bench development process involves a combination of preparing or purchasing models from independent suppliers, doing large amounts of HDL coding, manually gluing the pieces together and developing an exhaustive test sequence to evaluate the behavior of the ASIC in its intended environment.

Nowadays, it has become clear that even state of the art verification techniques are breaking down as ASIC complexities increase, and the trend is such that this already extremely difficult and time consuming task is getting more and more complex and critical.

Therefore, a strong need exists in the industry for a new system and method overcoming the problems of the state of the art.

SUMMARY OF THE INVENTION

The aim of the present invention is to provide a system and a method which allow to cut down the amount of time required in the generation of test benches for verifying ASIC circuits, with particular referral to memories, so as to reduce in a significant manner the design cycle time.

Within this aim, an object of the present invention is to provide a system and a method that easily create a set of test benches for the circuit or memory to be verified.

Another object of the present invention is to provide a system and a method that automatically generate a most comprehensive test bench according to available data specifying the ASIC or memory, covering all of the known aspects involved in the verification of circuits.

Yet another object of the present invention is to provide a system and a method that provide for automatic stimulus generations and re-usage of data.

This aim, these objects and others which will become apparent hereinafter are achieved by a computer based test bench generator for verifying integrated circuits specified by models in a Hardware Description Language. The generator includes a repository storing a general set of self-checking tests applicable to the integrated circuits. Means are provided for entering behavior data of an integrated circuit model and entering configuration data of the integrated circuit model. Means for automatically generating test benches in said Hardware Description Language are also provided and are configured to make a selection and setup of suitable tests from the repository according to the specified integrated circuit model, configuration and behavior data.

This aim and these objects are also achieved by a method for verifying integrated circuits specified by integrated circuit models in a Hardware Description Language. The method stores a general set of self-checking tests applicable to the integrated circuits in a repository. Behavior data of an integrated circuit model and Configuration data of the integrated circuit model are entered. Suitable tests from said repository are selected and set up according to the specified integrated circuit model, configuration and behavior data, so as to generate test benches in the Hardware Description Language.

The integrated circuit can be a memory specified by a memory model, which memory may be of any kind, including random access memory (RAM), read only memory (ROM), erasable and/or programmable read only memory (PROM/EPROM), and be either synchronous or asynchronous, single port, dual port or multi port.

Conveniently, the general set of tests may be generated in the same Hardware Description Language used to define the memory model, which language is preferably the Verilog language.

On the other hand, the behavior data of the integrated circuit or memory under test may be preferably specified in a proprietary language, so as to simplify its specification.

The configuration data of the integrated circuit or memory under test is preferably inputted to the generator through a command line or a configuration file, thus permitting a quick and handy configuration.

The test bench generator may advantageously select the tests applicable to the integrated circuit or memory under verification according to conditional statements, specifying whether a certain test is to be performed on a certain circuit according to the circuit behavior and specification, or through any other suitable means, for instance by checking multidimensional correspondence matrices storing indices of tests applicable to certain kinds of circuits.

Since the generation of test benches starts directly from the original design specification provided by the designer, the resulting test bench is guaranteed to match the design requirements.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 5 schematically shows the block structure of a proprietary language for writing input files according to the present invention;

DETAILED DESCRIPTION OF THE DRAWINGS

Figure 1:
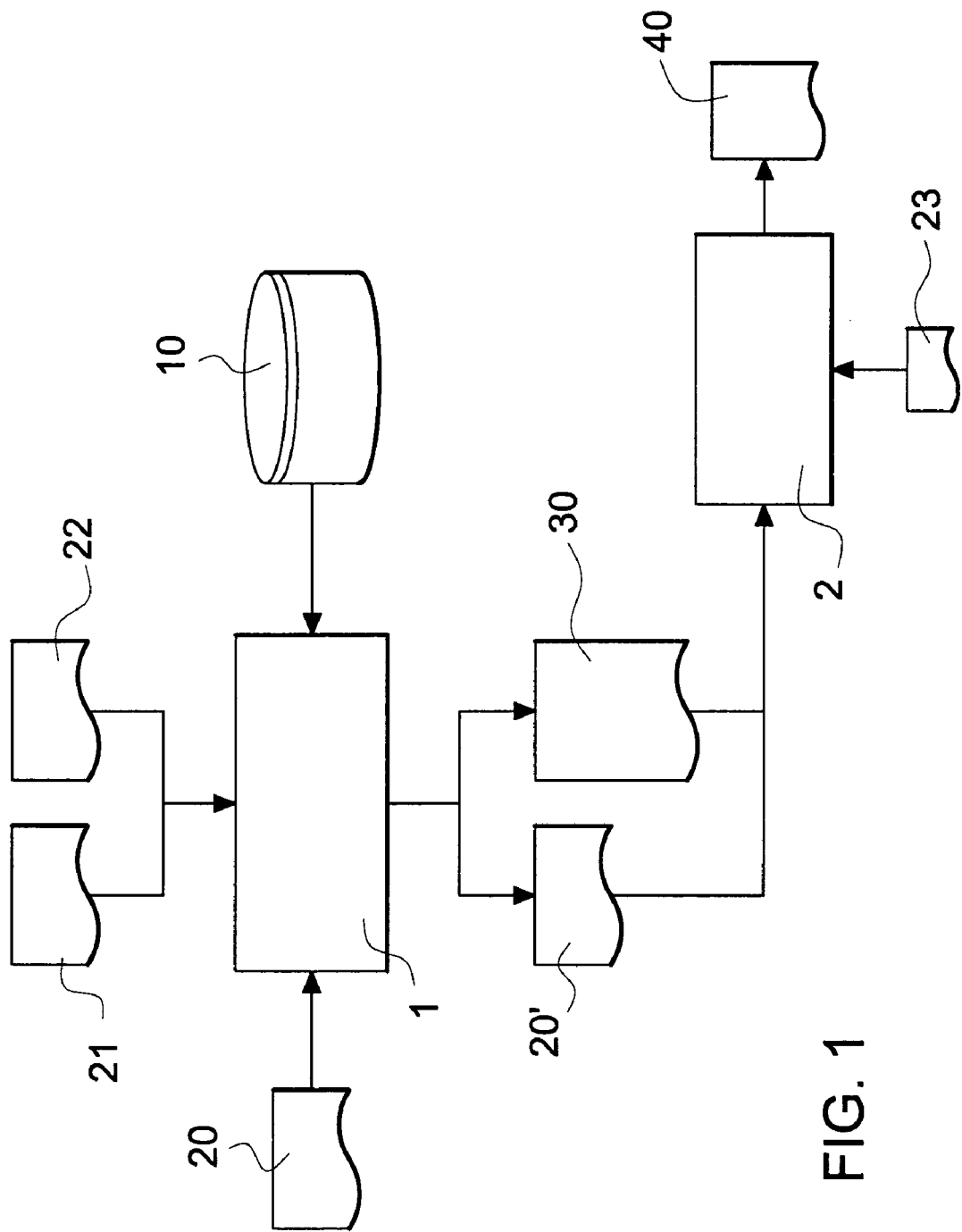
FIG. 1 is a schematic view showing a system according to present invention.

FIG. 1 shows an overall view of a preferred embodiment of the system, which is preferably a computer based system provided with hardware and software means for entering input data, generating and executing test benches and outputting verification data.

A preferred embodiment will be now described with specific regard to memories and correspondent memory models. However, one skilled in the art will appreciate that this choice has been made for clarity reasons only, and that it shall not be considered as a limitation of the system. The same concepts and description are in fact applicable to any kind of ASIC.

FIG. 1 shows two main modules: a test bench generator 1 and a simulator 2; it further shows a memory model repository 10 storing general data concerning as many kinds of memories as are available or useful for the designing activity, a specific memory model 20 to be tested and verified, behavior data 21 describing the behavior of the specific memory model 20, and configuration data 22 for setting up the configuration of the memory model. Such data is input data to the test bench generator 1 for generating test benches 30. Finally, FIG. 1 shows timing data 23 and report data 40.

The operation of the system is as follows.

A number of memory models are stored in the memory model repository 10, and catalogued according to structural and functional characteristics. Such structural characteristics include, but are not limited to, the type of memory (ROM, RAM, PROM, EPROM and so on) and the number of ports (single, dual or multi port), while functional characteristics include information indicating whether a memory is synchronous or asynchronous.

The repository is flexible, in that further models may be freely added as soon as they become available, together with information describing their characteristics.

The memory model 20 is the memory under test, as designed by the designer. The memory models stored in the repository 10 and the memory model under test 20 may be specified by means of a Hardware Description Language (HDL), which, in the preferred embodiment, is the widely known and used Verilog language. The formal syntax specification of this language may be found for instance in the Language Reference Manual available from Open Verilog International (OVI). It is also to be noted that a Verilog standardization process is being carried out by the IEEE 1364 Working Group, so that this language may be considered as a standard de facto in the field of electronic design automation.

Behavior data 21 is a template file, preferably written in a proprietary language so as to simplify the designer's activity according to proprietary standards and habits. One skilled in the art easily understands that such a proprietary language, which will be described in detail later on, may be replaced by any other suitable proprietary or non proprietary language.

The same applies to configuration data 22, which is used to input configuration data for a test session. Such configuration data is preferably input to the generator 10 through the command line, but any other suitable means may be used. For instance, it is possible to write a number of text files, each storing a different configuration, and passing them to the generator either by hand or through a batch file.

The test bench generator 1 parses the behavior data 21 and configures the memory model 20 according to the configuration data 22, generating a configured memory model 20'.

It then parses each characteristic of the memory model 20 and seeks for matching information in the general memory models stored in the repository 10, so as to define whether a test is applicable or is to be applied to the memory model 20. If so, the test is added to the test bench 30, otherwise the test is skipped.

In the preferred embodiment, the input data passed to the generator 1 are translated into self-checking Verilog test benches, which include self-checking models incorporating complex constructs such as comparing data, waiting for internal events and timing constraint checking.

So doing, the generator guarantees that an exhaustive test bench is generated for the memory model to be verified, in that all possible known tests are performed, with no need to rely on the designer to know which test to apply and thus waste time setting up each different test.

The generated test bench 30 is then inputted to the simulator 2, which reads the now fully configured memory model 20' and applies the test bench 30. The simulator 2, for instance, may be an incorporated Verilog simulator.

An adequate timing scale driving the simulation, as known in the art, may be entered, for instance through a "timings" file 23.

At the end of the simulation process, a set of reports 40 is produced, informing the designer about the outcome of the verification process.

In the preferred embodiment, the input given to the generator 1 for generating self-testing benches are of two types: Command line arguments 22 and a Template file 21.

The designer preferably specifies the memory configuration through command line arguments, which are detailed hereafter.

The behavior of the memory model under test is detailed using an input file called "Template", an explanation and a sample of which will follow.

A proprietary language has been designed for specifying memory behavior.

As soon as the designer has specified the configuration and the memory behavior of a memory to be verified, the generator 1 starts generating an appropriate test bench to cover all of the aspects of the specification.

Based on the number of signals to be handled and on the values each signal can take, a fully exhaustive test bench is generated.

The signals used for memory modeling are grouped into seven categories: Reference signals, Control signals, Data bus signals, Mask signals, Address bus signals, Output control signals and Output port signals.

Depending on the memory type, which can be either synchronous or asynchronous, a reference signal may or may not exist. In general, it is assumed that for a given memory design only one reference signal per cycle exists.

Control signals control the functioning of the designed memory, and any number of control signals is allowed for a given memory. Examples are the "WEN" or write enable signal and the "CSN" or "Chip select pin" signal.

Data bus signals are in charge of carrying data, and they are described depending on the memory type, whether read-only or not, in that they are of significance only for cycles during which data has to be written to memory locations. Mask signals include any signal used for masking other signals, be they data, address or output signals. Address bus signals carry the memory location value according to which data has to be either accessed or written. Output control signals are generally asynchronous signals controlling the access to an output port, which changes its state in accordance with the value of the output control signal. Output port signals indicate the one signal associated to an output port. Memory test benches are based on cycles: particularly, the generator 1 handles Read Cycle, Write Cycle, Normal Write Through Cycle, Data Write Cycle and Data Write Through Cycle tests.

A Read cycle means that data from a specified memory location is read and seen on an output port. A Write cycle means that data is written to a specified memory location. A Data write cycle means that a continuous stream of data is written to a specified memory location. The last data in the stream is the one that is finally retained, or written, at the memory location.

A Normal Write Through Cycle means that data is written to a specified memory location and that at the same time it is seen at an output port. This situation occurs when the read address and the write address are the same for a given cycle for a memory port.

A Data write through cycle means that a continuous stream of data is written to the specified memory location and at the same time it is seen at the output port. This occurs when the read address and the write address of the memory are the same for a given cycle for a memory port. The last data in the stream is the one that is finally retained, or written, at the memory location.

As already mentioned, Functional, Timing, Edge type, Ftype, Ttype and Simultaneous access tests are available for each cycle.

Functional test cases are generated for testing the functionality of the memory that is, if the cycles show the expected behavior for which they were designed, either in response to legal and illegal signal values.

Timing test cases are generated for verifying the memory behavior under various timing constraints such as, for instance, setup time, hold time, pulse width low, pulse width high and so on. Again, the behavior is tested against various legal and illegal signal values.

Edge type test cases are generated for testing simultaneously both the functionality and the timing constraints of a memory, and they are valid only for synchronous memories. In such test cases, a signal other than a reference signal changes its value as the edge of the reference signal changes. They are a special type of setup tests, where the setup time of any signal is taken to be zero.

Ftype test cases are generated for testing simultaneously both the functionality and the timing constraints of a memory, and they are valid only for synchronous memories. In such test cases, a signal other than a reference signal changes its value after a considerable lapse of time, then the edge of the reference signal changes. They are a special type of setup test, where the setup of time of any signal is taken to be greater than the original setup time, according to designer's definition.

Ttype test cases are applicable to synchronous memories only. In such test cases, a signal other than the reference signal changes its value after a considerable lapse of time, then the edge of the reference signal changes and some other signal is already showing a violation condition such as setup, hold, pulse width low and so on.

Simultaneous access test cases are generated for memories with more than one port, that is dual or multi-port, to verify simultaneous access behavior, and they are designed to test both the functionality and the timing constraints for a memory.

The output 30 of the generator is a Verilog test bench and a Header file.

The Verilog test bench comprises several files, including a file containing algorithms for calls to each type of the mentioned test cases and include files needed to run a simulation; a file containing the definition of each cycle type; a file containing a self-testing algorithm; a file containing functional test cases; a file containing timing and ttype test cases; a file containing edge and ftype test cases; a file containing simultaneous access test cases.

The test bench is generated hierarchically, first with regard to test on a port basis, then with regard to tests on a port on a cycle basis and finally for each signal defined in a cycle.

The header file contains all the declarations related to input, output, register, type variables and so on, in a way which is similar to a typical C header file. The instantiating model is also given in the Header file, which is written in Verilog.

Figure 2:
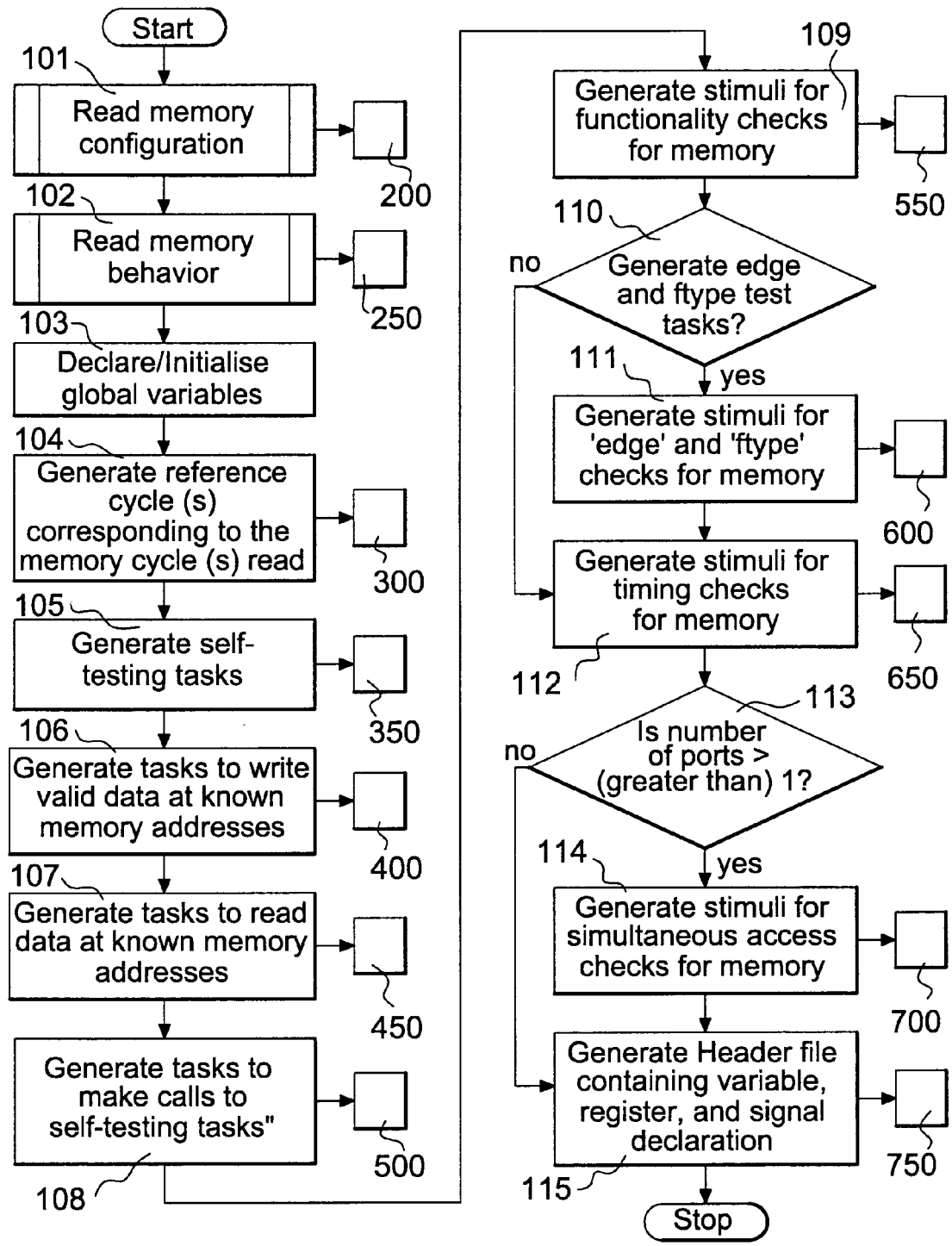
FIG. 2 is a data flow diagram showing an algorithm used for development.

FIG. 2 discloses the whole generation process according to the preferred embodiment of the present invention as performed by the generator 1.

At steps 101 and 102, the generator 1 reads memory configuration data 22 from the command line and memory behavior data 21 from a template, according to algorithms 200 and

250 respectively. At step 103 a number of global variables is accordingly declared and initialized.

At step 104 Verilog reference cycles corresponding to the memory cycles described in the input file are generated and written to file, according to algorithm 300.

At step 105 all the self-testing Verilog tasks are then generated and written to file, according to algorithm 350.

A number of tests are then unconditionally generated and written to file at steps 106-109, including tests to write valid data at known memory addresses (according to algorithm 400), tests to read data at known memory addresses (according to algorithm 450), tests to make calls to self-testing tasks (according to algorithm 500) and tests to generate stimuli for functionality checks for memory (according to algorithm 550).

The generator then verifies, at step 110, whether "edge" and/or "ftype" Verilog tests are applicable to the memory model under test and, if so, such tests are generated at step 111 according to algorithm 600 and written to the file.

At step 112, stimuli for timing checks for memory are generated and written to the file, according to algorithm 650.

Should the number of ports in the memory be greater than 1(step 113), stimuli for simultaneous access checks for memory are generated and written to the file at step 114, according to algorithm 700.

Finally, at step 115, a header file is generated, containing variable, register and signal declarations in Verilog or in the chosen HDL, according to algorithm 750.

Figure 3:
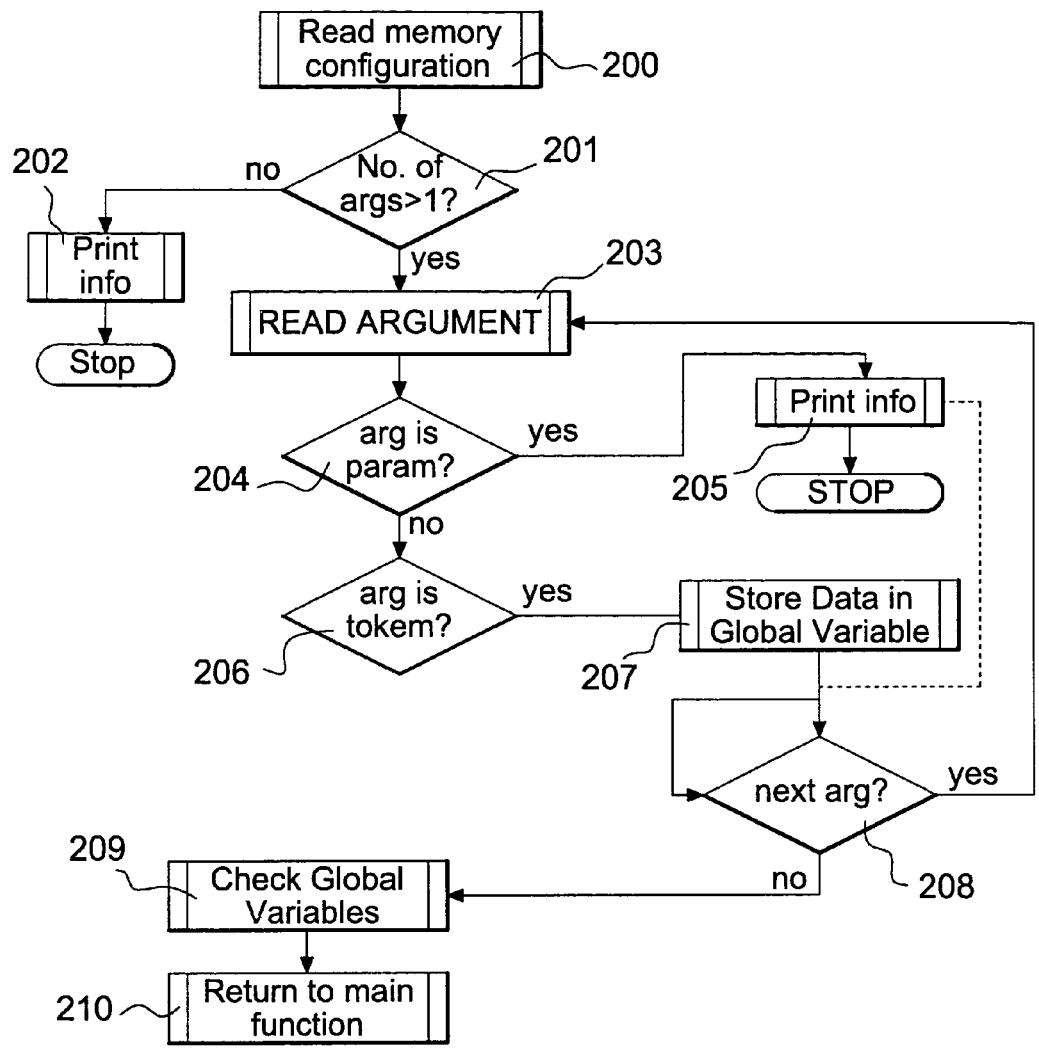
FIG. 3 is a data flow diagram showing an algorithm for reading memory configuration.

Algorithm 250 is shown in FIG. 3 in its general embodiment. The read memory configuration process 200 starts by checking (step 201) the number of arguments passed to the generator, in whatever form they are actually defined. For instance, the check may be made on the content of a configuration file or in the number of arguments passed through the command line to the application program.

If the outcome of the check is negative, information is printed on screen explaining the correct use of the generator (step 202). Otherwise the flow continues to step 203, where the first argument is read.

Broadly speaking, arguments may be of two different types, hereby identified as information parameters and language tokens.

An information parameter is an argument that asks the generator to provide feedback to the user, for instance to print help information or a list of currently set values.

A language token is an argument that is used to enter actual configuration data, like the model name of the memory model, the number of test words or test values.

In the former case (step 204), the generator performs the required action (step 205) and then either stops execution or goes on to the next argument, depending on the actual parameter; in the latter case (206), the generator stores data in a corresponding global variable (step 207), and then checks (step 208) whether further arguments are available. If so, the algorithm loops back to step 203 to read the next argument, otherwise it performs a check (step 209) on the current value of global variables, and sets default values in the case that some of these variables have not been initialized. The process then returns to the main function in step 210.

A list of tokens made available in the preferred embodiment is provided below:

modelname: memory model name. Same as included in the Header File for memory model instantiation.

bits: number of bits per word.

twords: number of words sampled per set to test the status of the memory model.

twin: test window to be used for timing tests.

step: step size for the reference signal transition.

ford n: order of the functional tests to be conducted.

edge n: order for the checks to be performed on reference signal transition.

ftype n: order for the ftype checks.

ttype n: order for the ttype checks.

simcombupto n: number of port combinations to be accessed simultaneously, in case of a multi-port memory.

simcombreadcyc <YES/NO>: the type of memory cycle combinations to be generated for simultaneous access.

NO: print all those simultaneous access combination for memory cycles that have one write cycle at least.

YES: print all types of memory cycle combinations.

simviol <VN/VV>: type of simultaneous access combinations to be generated for timing checks (hold/setup).

VN: one port memory cycle has a signal timing violation and the other ports have normal memory cycle.

VV: all ports have memory cycles in which one signal has a timing violation and no port has a normal memory cycle.

template: specify the template file name and path.

tfile: specify the name of the output test bench file.

hfile: specify the header file name.

headertype: set the format of the header file to be generated, either BUS or BIT (splitted bus).

rom: generate Verilog test benches for ROMs.

rep: specify the name of an output file containing simulation results as performed by the simulator 2.

cm: control monitor, turn off the monitoring of signals during self-testing that is, setting of signals and reading of signals before and after each test case is executed, to maximize speed and reduce the size of the output file.

h: print a detailed message on the available command line options.

u: print generator usage and execution command information.

d: debug mode, output the internal data structure built after reading the template file.

A data flow diagram exploded from the data flow diagram of FIG. 3 in conjunction with the list of tokens above is given as reference in FIGS. 4a-4h.

Going back to FIG. 2, block 250 refers to the reading of memory behavior from a template file 21, written in a proprietary language which will be now described in detail with referral to FIG. 5.

The template file begins with a specific construct, for instance "TEMPLATE <library name><model name>" and ends with "END TEMPLATE", and is divided into two main blocks 51 and 52.

The first block 51 holds the description of the ports, such as the number of memory ports, the port names and the type of the ports (Read, Write, Read-Write).

The second block 52 describes the cycles and behavior of the port. For each port, blocks 51 and 52 are repeated with the relevant information needed for testing and describing both the memory structure and its behavior.

The port definition, which corresponds to block 52, is in turn divided into six sub-blocks 61-66, which contain a description of the signal, of the memory cycles supported by the model and of the behavior of each port (the modeling style), and a specification on how the memory model is expected to behave when the signals take different values.

All the text between a "##" symbol and the end of a line is considered as a comment. List items are separated using a comma ",", while statements are terminated by a semicolon ";".

In more detail, block 51 defines the beginning of the memory model description file.

The "library name" parameter is an alpha-numeric value that specifies the technology for which the memory model has been designed.

The "model name" parameter is another alpha-numeric value which specifies the name of the memory model, the description of which is being defined in the file.

The "MEM_TYPE <SYNC/ASYNC>" instruction is used to define the type of the memory, which can be either synchronous or asynchronous. "SYNC" indicates that the memory type is synchronous, and that a reference signal therefore exists; "ASYNC" indicates that the memory under test is asynchronous, and that no reference signal exists.

The "NUM_OF_PORT <constant>" statement defines the number of ports supported by the memory model, wherein "constant" is an integer numeric value.

The following statement

```
TYPE PORT
    PORT <port name> <port type>
    CONTENTION <time>
END PORT
``` defines the type of the ports that are supported by the memory model. The port description statements are enclosed within "TYPE PORT" and "END TYPE" keywords. The "PORT" statement is then repeated depending on the number of ports available in the memory model to be verified.

Particularly, the port name is an alpha-numeric value which specifies the name of the port as described in the memory model, and port type is used to set the type of the port. This is an alphabetic value selected from the following group: "R", to indicate a read only port, "W" for a write only port and "RW" for a read-write port.

The "CONTENTION" statement is used to define the time difference between two sampling edges of the clock when two ports are accessed simultaneously, and it is set through the "time" parameter, which is a positive integer value. This statement is used for memories with more than one port and with non-zero contention time only.

Block 52 defines the cycles and behavior of the memory with regard to a certain port. The entire description is enclosed within a "BEGIN PORT" and "END PORT" block. The block is repeated depending upon the number of ports that exist for the memory model under test.

Block 61 is needed whenever a memory model has more than one read type port, to specify from which port the read operation shall be performed and to check the contents of the memory.

If the port is of the read-write type ("RW"), reading the memory contents onto the same port is allowed. On the other hand, memories with more than one read port need the above statements, as it is the case when the port is of the write type ("W"), in that it is necessary to access a read port to read memory contents after any testing operation is performed on the port.

The "port name" parameter is an alpha-numeric value specifying the name of the port. An "ALL_PORTS" parameter is provided to specify that a read operation is to be performed from all the existing read-only ("R") and read-write ("RW") ports defined in the memory model.

Block 62, which is defined as

```
DEFINE SIGNAL
    ADDR <words> <var>
    DATA <var>
    OUTP <var>
END DEFINE
``` stores information related to signals, including addresses, data and active outputs for a port. According to the type of a port, it will be appreciated that that "ADDR" and "DATA" are required for a Write-only port, "ADDR" and "OUTP" are required for a Read-only port and "ADDR", "DATA" and "OUTP" are required for a Read-Write port.

All the information is enclosed within "DEFINE" and "END DEFINE" statements.

The "words" parameter specifies the number of words for the memory port, and is used to extract information concerning the number of address lines.

The "var" parameter defines the name of the address or data or output variable as defined in the memory model for the port.

Block 63, which is defined as "FTYPE <signal combination list>", details information related to "FTYPE" tests.

The <signal combination list> parameter defines the signal types for which the tests have to be performed, choosing from the list of keywords: "CTRL", "MASK", "DATA", "ADDR" and "OCTRL".

```
BEGIN TTYPE
    FOR <signal type> <time list/SIMULT> TEST
    <signal combination list>
    . . .
END TTYPE
``` details information related to "TTYPE" tests.

The block is enclosed within "BEGIN TTYPE" and "END TTYPE" statements. The "FOR" statement describes the details related to the type of test vector to be generated and can be repeated several times within the same block depending on the memory functionality to be verified.

The statements specify information concerning signals that will show a violation condition and signals whose value will change after a violation has occurred.

The "signal type" parameter specifies the signal type, which again can be "CTRL", "MASK", "DATA", "ADDR" or "OCTRL".

The "signal name" parameter specifies the name of the signal as defined in the memory model, and can be entered in alpha-numeric form.

The "time list" parameter specifies the type of violation to be forced on the signal, selected from the group which comprises: "SETUP", "HOLD", "PWL", "PWH", "PER", "SIMULT".

The "signal combination list" parameter defines the signal types for which the tests have to be performed, choosing from the same list of keywords: "CTRL", "MASK", "DATA", "ADDR" and "OCTRL".

Depending on the value of the "TTYPE" variable, the list may vary.

Block 65, which is defined as

```
BEGIN <cycle name>
    Signal description blocks
END <cycle name>"
``` indicates the cycles supported by the memory port.

The block is repeated depending on the number of cycles defined for the port. The basic description includes the definition of each signal type, including its active value, test values, setup and hold timings.

The Verilog test vectors that will be generated at the end of the process take their signal values from the information described in this section. The exhaustiveness of the test cases will also depend on the information detailed in the cycle definition block.

The entire information related to a particular cycle is enclosed within "BEGIN" and "END" statements followed by the cycle name, as defined by the designer.

As already mentioned, the commonly supported cycles for any memory are: Read cycle, Write Cycle, Normal Write Through Cycle, Data Write Cycle, Data Write Through Cycle.

A Signal Description Block is defined as shown below:

```
BEGIN <signal type> <signal name>
    PWL                    <time>
    PWH                    <time>
    PERIOD                 <time>
    PWLTRANS               <reference signal transition list>
    PWHTRANS               <reference signal transition list>
    PERTRANS               <reference signal transition list>
    TRANS                  <signal transition list>
    ACTIVEDGE              <edge type>
    SETUPEDGE              <edge type>
    HOLDEDGE               <edge type>
    SIZE                   <bit size of the signal>
    ACTIVE                 <value>
    TESTALSO               <value list>
    ADDR_FULL_UNKNOWN
    ADDR_PARTIAL_UNKNOWN
    SET <time> BEFORE <reference signal name>
    SET <time> AFTER <reference signal name>
    SET <time1> BEFORE/AFTER THRU <time2>
BEFORE/AFTER <reference signal name>
END <signal type>
```

The signal description is enclosed within "BEGIN" and "END" statements followed by a definition of the signal type.

It is assumed that all the memory signals are grouped into the already mentioned seven different signal types, which are understood by the generator according to the following wordings: "REF" for reference signals; "CTRL" for control signals; "MASK" for mask signals; "ADDR" for address bus; "DATA" for data bus; "OUTP" for output signal; "OCTRL" for output control signal.

The designer can select any type for various signals defined in the memory model and define its attributes in the signal description block. There is no limit defined for the number of signals that can be defined for the cycle, provided that each signal bears a unique name.

The order of the statements within the signal description block is not important: however the statements cannot be repeated within the same block, with the exception of "SET" statements (timing description).

The "BEGIN <signal type><signal name>" statement defines the beginning of the signal description block. The "signal type" parameter specifies a signal type selected from one of the aforementioned seven categories, while the "signal name" parameter is an alpha-numeric value specifying the name of the signal as defined in the memory model for that cycle of the port for which the signal description block is being described.

The "PWL <time>" statement is specific to the Reference signal type, and it is used by the designer to define the Pulse Width Low time for the reference signal, for instance the Clock, through the "time" parameter, which is an integer value.

The "PWH <time>" statement is specific to the Reference signal type, and it is used by the designer to define the Pulse Width High time for the reference signal, for instance the Clock, through the "time" parameter, which is an integer value.

The "PERIOD <time>" statement is specific to the Reference signal type, and it is used by the designer to define the total cycle time for the reference signal, for instance the Clock, through the "time" parameter, which is an integer value. It is mandatory that the "PERIOD" statement be accompanied by a "PWL" statement.

Figure 6A:
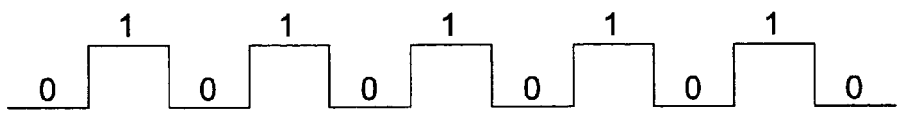
FIGS. 6a and 6b show reference signals respectively providing "0-1-0"and "1-0-1"transitions.

The "PWLTRANS <reference signal transition list>" statement is specific to the Reference signal type and is used to define transitions for the Pulse Width Low states of the reference signal. For example, a transition "0-1-0" implies that the reference signal is of the type shown in FIG. 6a. The statement has no meaning if a "PWL" statement has not been specified in the signal description block.

The "reference signal transition list" parameter is the list of the reference signal transitions for which the test vectors have to be generated. A comma "," is used as a separator in the list. Each transition is five characters long, and a hyphen "-" is used as a separator for each value. Allowed values are: "0", "1", "X" and "Z".

Figure 6B:
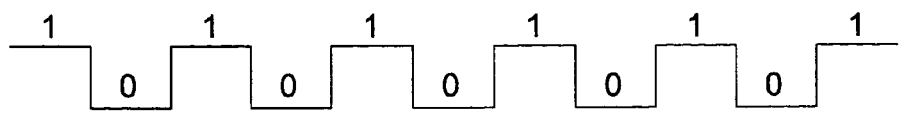
Figure 4A:
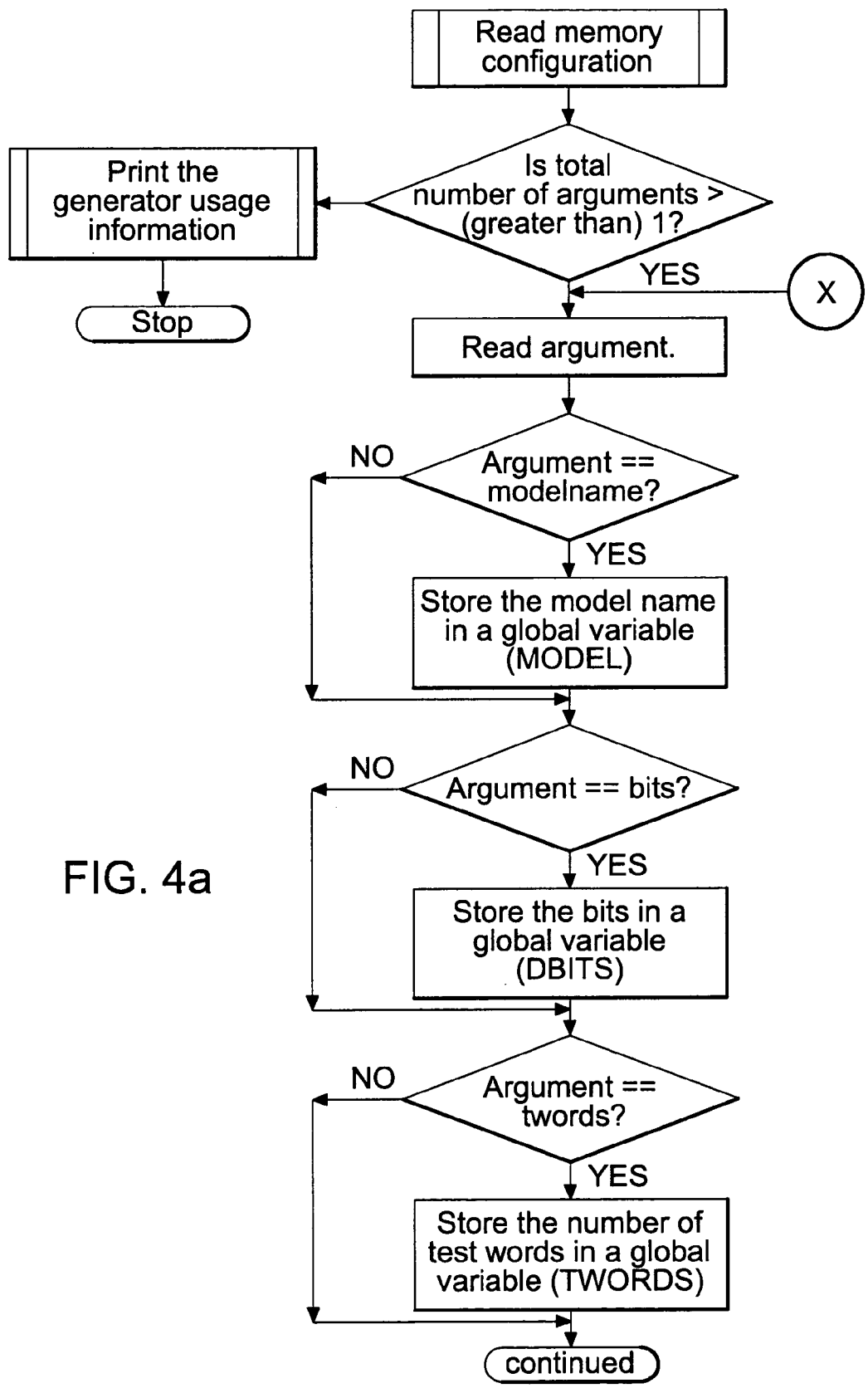
FIGS. 4a-4h show an exploded version of the data flow diagram of FIG. 3, showing an algorithm used for reading memory configuration in a preferred embodiment.
Figure 4B:
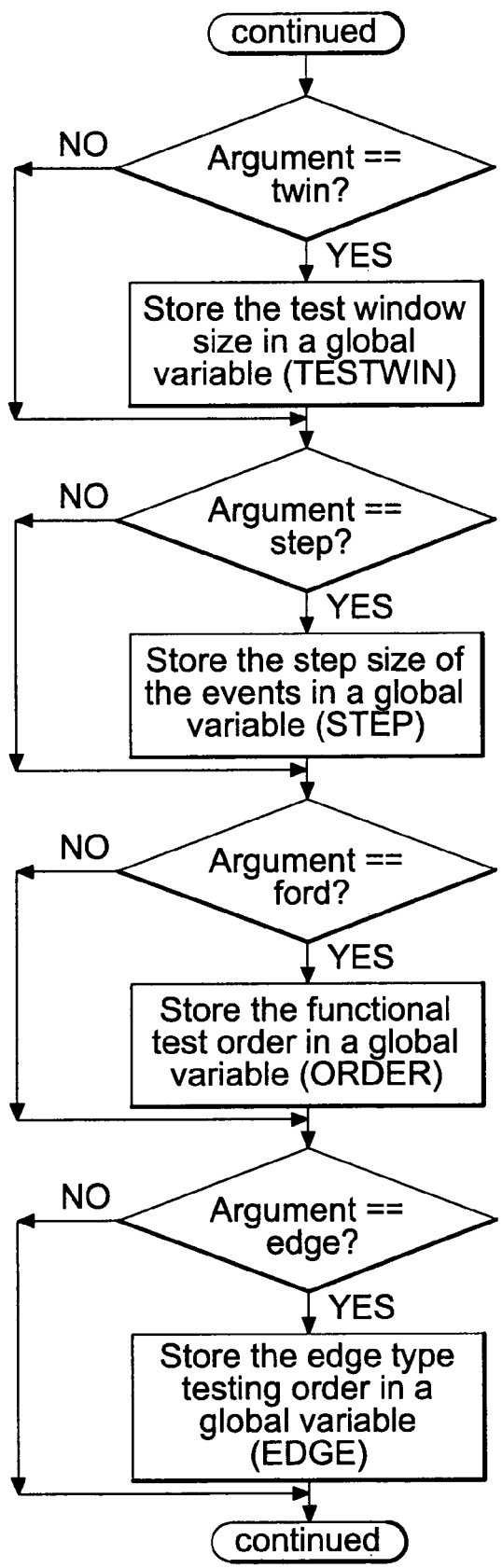
Figure 4C:
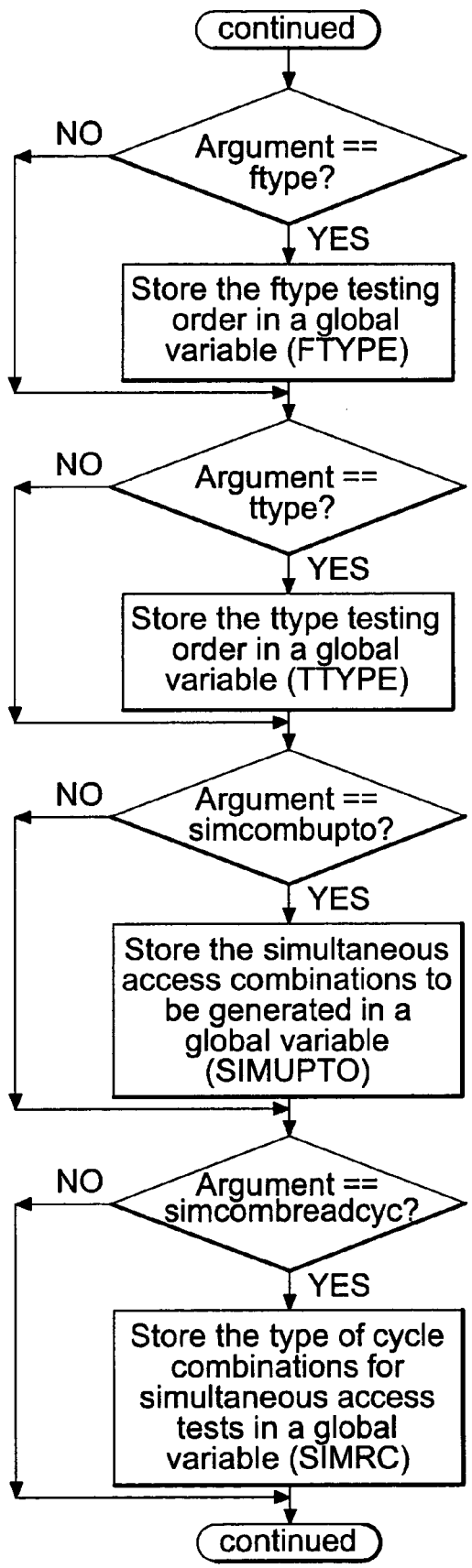
Figure 4D:
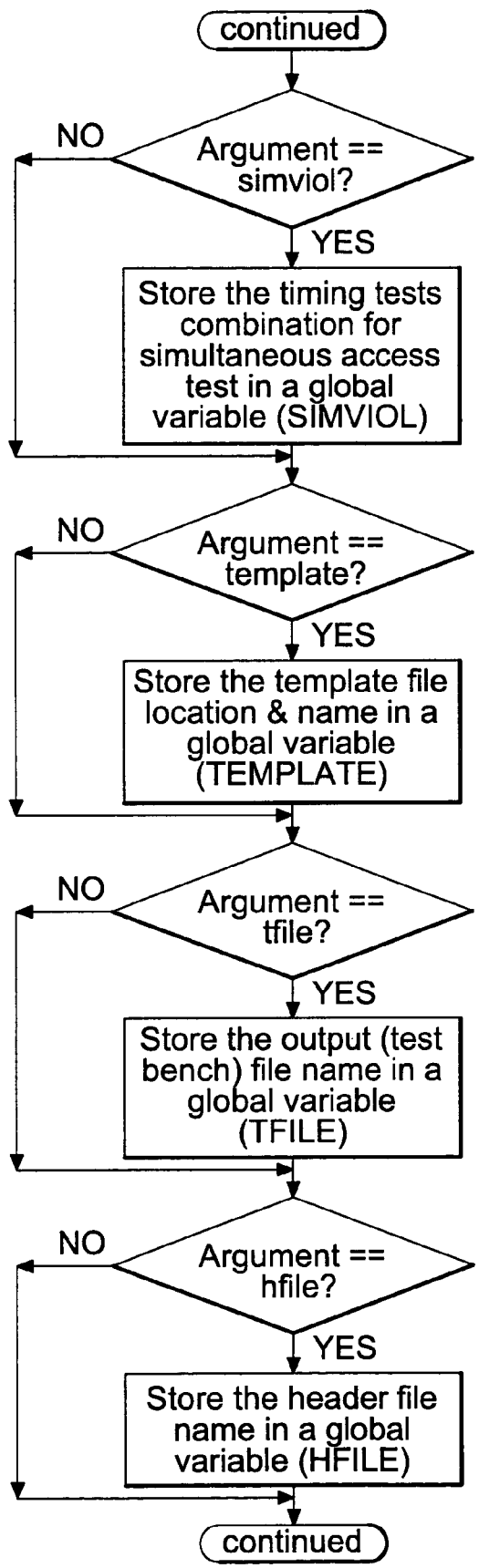
Figure 4E:
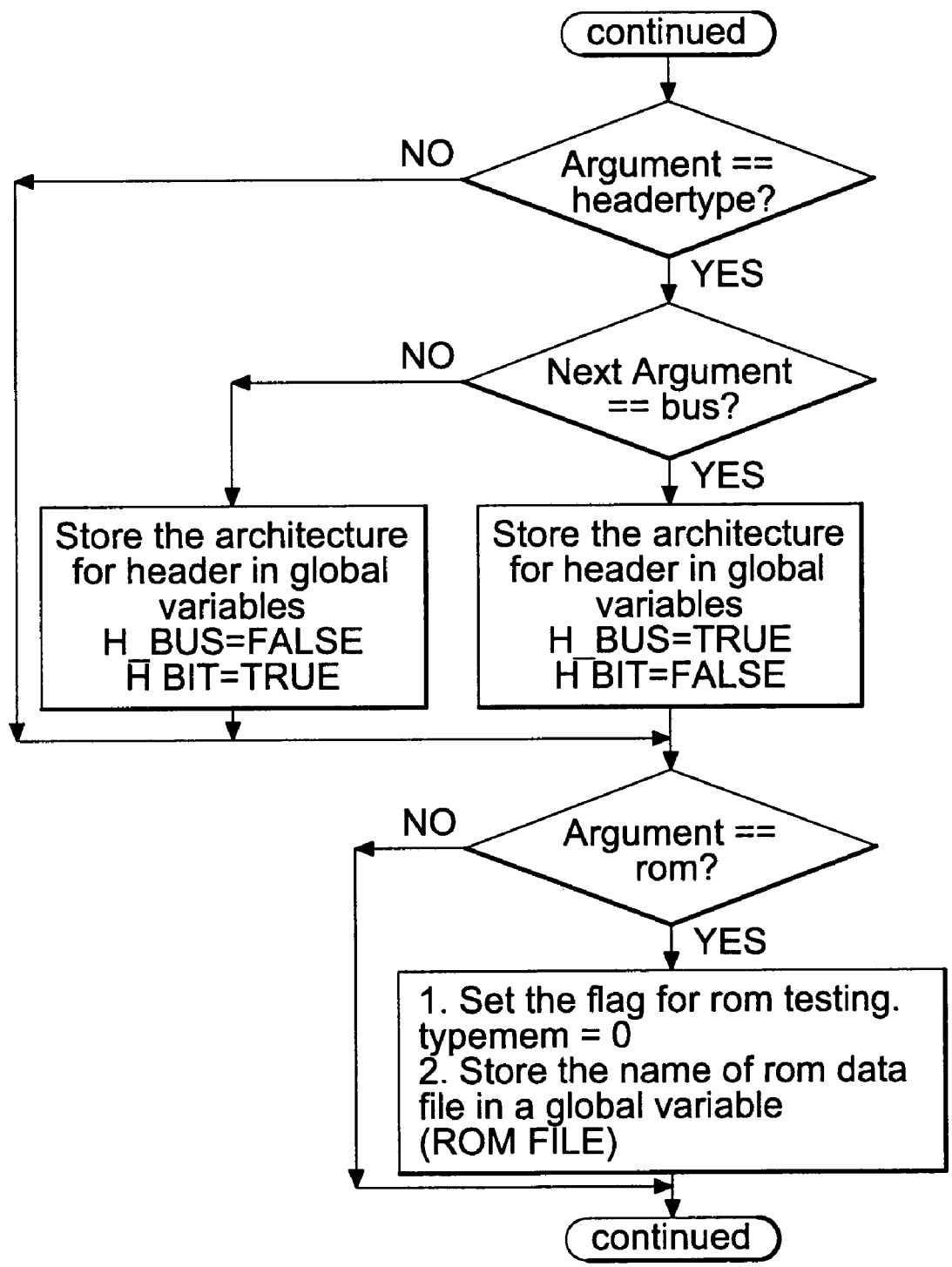
Figure 4F:
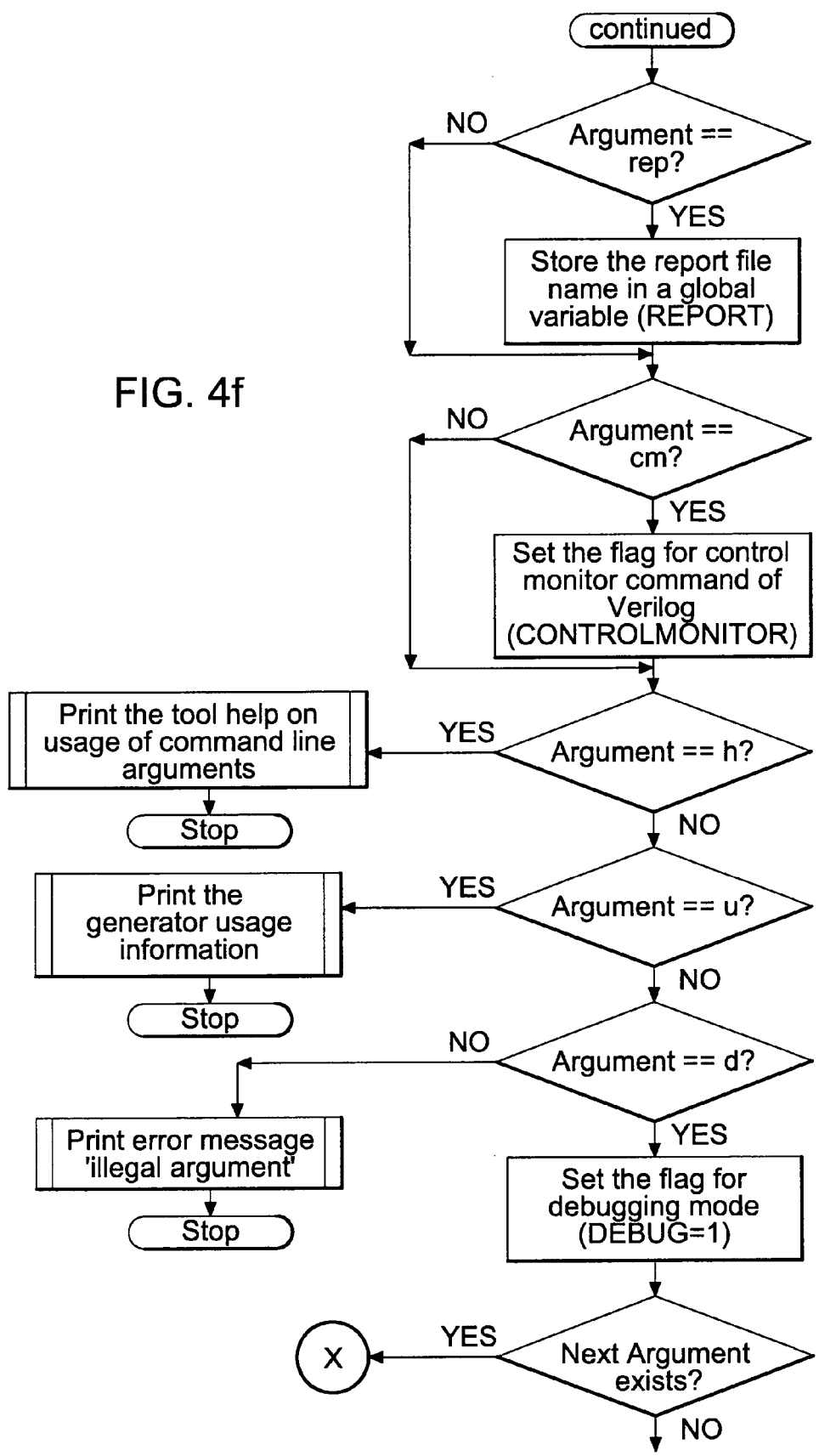
Figure 4G:
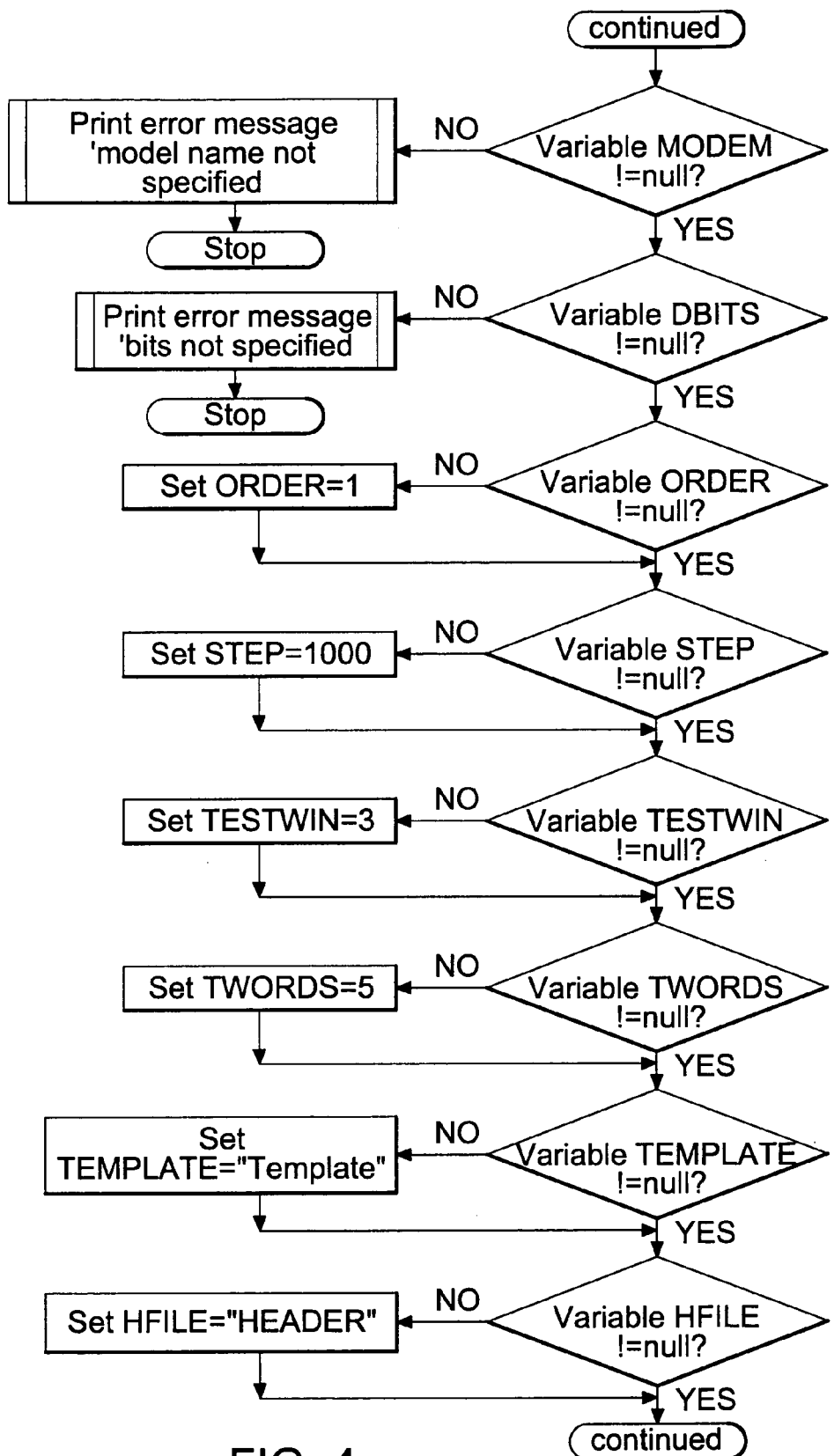
Figure 4H:
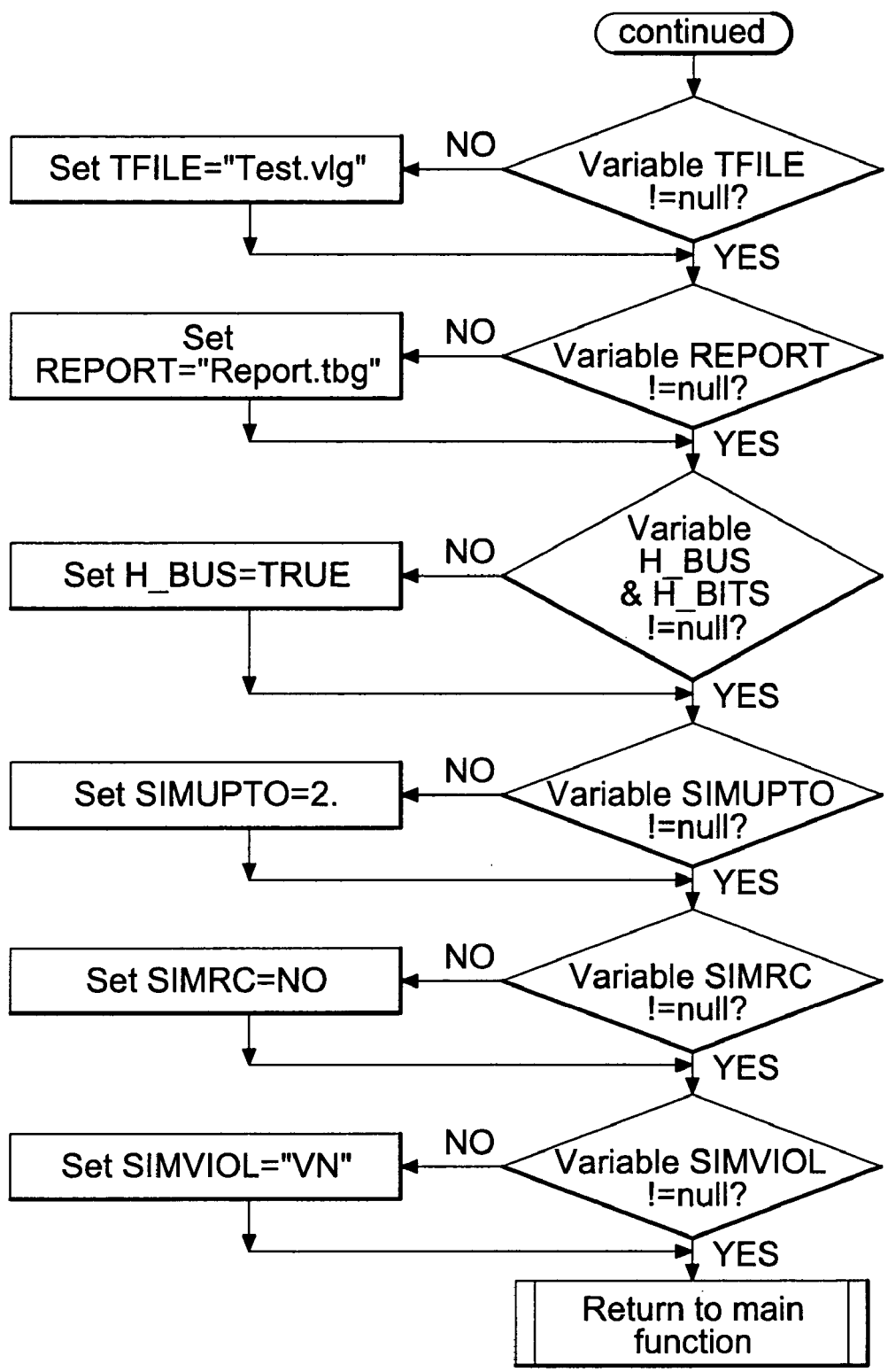

The "PWHTRANS <reference signal transition list>" parameter is specific to the Reference signal type and is used to define transitions for the Pulse Width High states of the reference signal. For example, a transition 1-0-1 implies that the reference signal is of the type shown in FIG. 6b. The statement has no meaning if a "PWH" statement has not been specified in the signal description block.

The "reference signal transition list" parameter is the list of the reference signal transitions for which the test vectors have to be generated. A comma "," is used as a separator in the list. Each transition is five characters long, and a hyphen "-" is used as a separator for each value. Allowed values are: "0", "1", "X" and "Z".

The "PERTRANS <reference signal transition list>" statement is specific to the Reference signal type and is used to define a transition for the reference signal. The statement has no meaning if both the "PWL" and "PERIOD" statements have not been specified in the signal description block.

The "reference signal transition list" parameter is the list of the reference signal transitions for which the test vectors have to be generated. It has been noticed that the best results from the tests are obtained when valid transitions for "PERIOD" checking are: "0-1-x", "0-1z", "1-0-x", "1-0-z", "x-0-1", "z-0-1", "x-1-0", "z-1-0".

The "TRANS <signal transition list>" statement is applicable to all signal types except for reference signals, and is used to define the signal transition from one state to another.

This is mainly used for Setup Violation, Hold Violation, Edge type tests, Ftype type tests and Ttype type tests.

The "signal transition list" parameter is the list of signal transitions for which the test vectors have to be generated. Commas "," are used as a separator in the list. Each transition is three characters long, with a hyphen "-" as a separator between two values. Allowed values are: "0", "1", "X", "Z", for instance "0-1", "0-x".

The "ACTIVEDGE <edge type>" statement is applicable to all signal types except for reference signals, and is used to define the active edge of the signal with respect to the reference signal. Supported "edge type" values are "RISE" and "FALL".

The "SETUPEDGE <edge type>" statement is applicable to all signal types except for reference signals. This statement is usable only if the signal shows the setup condition at an edge other than the active edge defined in the "ACTIVEDGE" statement. These statements are specific to signals that show timing constraints (synchronous signals). Supported "edge type" values are "RISE" and "FALL".

The "HOLDEDGE <edge type>" statement is applicable to all signal types except for reference signals. This statement is usable only if the signal shows the hold condition at an edge other than the active edge defined in the "ACTIVEDGE" statement. These statements are specific to signals that show timing constraints, for example, synchronous signals. Supported "edge type" values are "RISE" and "FALL".

The "SIZE <bit size of the signal>" statement is applicable to all signal types except for reference signals and is used to specify the size of the signals.

The "bit size of the signal" parameter can be specified through three different approaches: using the "DBITS" keyword if the size is equal to data bus size, using the "ABITS" keyword is the size is equal to address bus, using a numeric value otherwise.

The "ACTIVE <value>" statement is applicable to all signal types except for reference signals. Each signal has its active value at which it performs the legal operation, hence the statement to specify the same is required. The value parameter can be either "0"or "1".

The "TESTALSO <value list>" statement is applicable to all signal types except for reference signals.

The test cases are mainly generated to test the memory functionality at its active legal value and to check the memory behavior at various illegal states of the signal.

The value list parameter is a list of values separated by a comma ",". Allowed values are: "0", "1", "x", "z".

The "ADDR_FULL_UNKNOWN" statement is specific to address type ("ADDR") signals and instructs the generator to generate test cases so that memory behavior can be verified when a totally unknown address signal is passed.

The "ADDR_PARTIAL_UNKNOWN" statement is specific to address type ("ADDR") signals and instructs the generator to generate test cases so that the memory behavior can be verified when a partially unknown ("0x0x") address signal is passed.

The "SET <time>BEFORE <reference signal name>" instructs the generator to generate test cases to verify the "SETUP" conditions for the memory.

The "time" parameter is the setup time for the signal, while the "reference signal name" parameter is the name of the reference signal against which the setup condition has to be verified.

The "SET <time>AFTER <reference signal name>" statement instructs the generator to generate test cases to verify the "HOLD" conditions for the memory.

The time parameter is the hold time for the signal and is either a numeric value or a variable defined in the "Timings" file.

The "reference signal name" parameter is the name of the reference signal against which the hold condition has to be verified.

The "SET <time1>BEFORE/AFTER THRU <time2> BEFORE/AFTER <reference signal name>" statement specifies that applying different transitions from "time1" before/after to "time2" before/after the reference signal transition, in incremental time steps, should test the signal.

The "END <signal type>" statement defines the end of the signal description block, while the "signal type" parameter specifies the signal type from the already mentioned seven categories.

Block 66 is defined as
BEGIN BEHAVIOR
Memory behavior blocks . . .
END BEHAVIOR and specifies the memory behavior under normal or legal conditions. In addition, it also defines how the memory behaves when an illegal signal value is encountered at any signal.

One "BEHAVIOR" block must be defined for each "PORT" block. The block has two main sections: a first one which regards the normal behavior of all cycles defined for the port and a second one which regards the behavior of the memory and port output for various test values.

The first section takes the following form:

```
DEFINE NORMAL <cycle name>
    START AT REF <reference signal name> <edge type>
    COND <data & address states>
    OUTP = MEM <operation> <output mask signal>
    MEM = DATA <operation> <data mask signal>
    ADDR = ADDR <operation> <address mask signal>
    TEST <test list>
END NORMAL
```

The normal behavioral description of the memory is enclosed within "DEFINE NORMAL" and "END NORMAL" statements. The block is repeated depending upon the number of cycle definitions defined for the port.

The "cycle name" parameter value has to be identical to that defined in the cycle description block for synchronization.

The "START AT REF <reference signal name><edge type>" statement specifies the active edge for the reference signal at which the cycle begins.

The "reference signal name" parameter is the name of the reference signal defined for the cycle, while the "edge type" parameter is selected from the group which comprises: "RISE", "FALL", which are primarily used for synchronous memories and "CHANGE", which is primarily used for asynchronous memories.

The "COND <data & address states>" statement describes the memory behavior with respect to the state of the data and address bus.

For instance, when defining a Normal Write Through cycle, the read address and the write address are same, and the corresponding statement is: "COND ADDR EQ".

Similarly when defining the Data Write Through cycle, the read address and the write address are same while the data keeps changing its value. The statement will then be defined as "COND ADDR EQ && DATA CHANGE".

The "data state" parameter is set to "DATA CHANGE", and the "address state" parameter is "ADDR EQ", while the "&&" operator is used as a relational "AND" operator to define more than one condition.

The following statement
OUTP=MEM<operation><output mask signal>
MEM=DATA<operation><data mask signal>
ADDR=ADDR<operation><address mask signal> describes the transformations that may need to be done on the output, memory and address signals.

The "operation" parameter is one of the boolean operators: "AND", "OR" and "XOR" or "MSK", for Mask.

For example, when defining a Read cycle, the data at the memory address is shown on the output port; hence the statements used to define will be: "OUTP=MEM" and "ADDR=ADDR". The equation "MEM=DATA" is not needed as there is no data being written onto the memory.

Similarly, to define the Write cycle, all the three equations will be used: "OUTP=MEM", "MEM=DATA" and "ADDR=ADDR".

The "TEST <test list>" statement is used to add a self-checking of the memory when a test is not comprised in the standard checking mechanism pool embedded in the generator. This statement defines the default tests to be conducted for the specific cycle when the action for any particular signal value combination is not specified in the BEHAVIOR block.

The "test list" parameter can be either "MEM" or "OUTP". "MEM" tests are used when the contents of the memory need to be tested and "OUTP" for testing the output port. For example, in the case of a Read cycle, the output port needs to be tested; hence the statement will be: TEST OUTP.

In the case, of a Write cycle, the memory contents need to be tested; hence the statement will be: TEST MEM.

Finally, in the case, of a Normal Write Through cycle the memory contents as well as the output port need to be tested; hence the statement will be: "TEST MEM, OUTP".

The second section is defined as:

```
DEFINE ALIAS <cycle name 1>
    WHEN <cycle name 2> <signal name> <signal value>
END DEFINE
```

At times, it is observed that the behavior of one cycle is identical to other if the signal value changes for certain pins. For instance, in the case of a "WEN" (write enable) instruction, a "LOW" ("0") indicates Write Cycle whereas a "HIGH" ("1") indicates Read Cycle. "ALIAS" statements help in simplifying the description of such memory behavior.

The "cycle name 1" parameter is the name of the cycle for which the alias or substituting condition is being defined; the "cycle name 2" parameter is the name of the cycle which will be substituted; the "signal name" parameter is the name of the signal as defined in the signal description block for the cycle and the "signal value" parameter is the signal value, which is generally set to "0" or "1".

As an example, the following piece of code:

```
DEFINE ALIAS WRITE_CYCLE
    WHEN READ_CYCLE WEN 0;
END DEFINE
``` implies that a Read Cycle aliases to a Write Cycle if "WEN" changes to "0". Hence, the generator will automatically know to test for a Write Cycle behavior.

The following statement

```
DEFINE <cell state>
    WHEN
    . . .
END DEFINE
``` describes memory behavior behaving in an abnormal way, as it occurs under certain violation conditions.

The "cell state" parameter indicates the state of a cell. Such states are broadly classified as Memory states and Port states.

Memory states are listed below, together with keywords activating such states:

CORRUPT_ENTIRE_MEM: corrupt entire memory. The entire memory data at all locations is set to "X".

CORRUPT_LATCHED_LOC: corrupt latched location. The memory data at a particular location is set to "X".

MEMORY_NOCHANGE: memory no change. The memory data at all locations remains unchanged with respect to its previous state.

CORRUPT_DATA_BIT_MEM: corrupt data bit memory. The entire data is not wholly corrupted, but some bits only are set to "X".

CORRUPT_MASK_BIT_MEM: corrupt mask bit memory. The mask signal is not corrupted only some bits are to X.

Port states are listed below:

PORT_UNKN : port unknown. The output port is all set to "X."

PORT_HIZ: port high impedance. The output port is all set to "Z".

PORT_NOCHANGE: port no change. The output port remains unchanged with respect to its previous state.

The following statement

```
DEFINE OVERFLOW
    WHEN
    . . .
END DEFINE
``` describes an overflow condition, which occurs when a memory is accessed beyond the word limit for which it had been designed.

With regard to Signal State Description, the following statements are used to describe the signal behavior and violation conditions:

```
<cycle name> <signal type> <signal name> IS
    <violation condition 1>
    <cycle name> <signal type> <signal name> <violation condition 2>
    <cycle name> <signal type> <signal name> TRANS
    <signal transition list>
```

The "cycle name" parameter is the name of the cycle for which the self testing is being defined. If the parameter is set to "ALL_CYCLES", then the same test has to be repeated for all cycles described for that port.

The "signal type" parameter indicates one of the seven categories supported by the generator: "REF", "CTRL", "ADDR", "DATA", "MASK", "OCTRL", "OUTP", which have been already explained.

The "signal name" parameter is the name of the signal defined for the type being described in the statements, which should be the same as defined in the signal description block of the port, for a given cycle.

The "violation condition 1" parameter is a signal state which causes an abnormal memory behavior, and takes one of the following values: "X" if the signal is fully unknown; "P", if the signal is partially unknown, "Z", if the signal is at high impedance, "1" or "0" if the signal shows a corresponding value, "O" to define an address overflow condition.

The "violation condition 2" parameter is a signal state which causes an abnormal memory behavior, and is selected from: "PWL", if the signal shows pulse width low violation; "PWH", if the signal shows pulse width high violation; "PER", if the signal shows period violation.

The above statements are in context to the reference signal only, while the following are applicable to any signal type, except for reference signals: "SETUP", if the signal shows setup violation; "HOLD", if the signal shows hold violation; "SIMULTANEOUS", if the signal is under simultaneous access (requires that a simultaneous access behavioral block be defined).

The "signal transition list" parameter indicates the signal transitions causing an abnormal memory behavior, which is, in general, in context to the reference signals.

The following statement:

```
DEFINE SIMULT
WHEN
...
END DEFINE
``` defines the conditions for testing the memory and output port under simultaneous access, in case of memories having more than one port.

The signal state description and violation conditions thereof are defined through the following statements:

SIM CYCLE <cycle name 1>CYCLE <cycle name 2><signal type><signal name>SIMULTANEOUS, where the two "cycle name" parameters indicate the cycles that are being simultaneously accessed from the two different ports, and "signal type" is the type of the signal, out of the aforementioned seven categories, and "signal name" is the name of the common signal between the two cycle of two different ports.

A sample of a template is provided for illustrative purposes below:

```
defining the write cycle block.
We mention the signals and its description.
BEGIN WRITE_CYCLE
    ## if the memory is synchronous the reference signal
    ## is defined.
    DEFINE REF CK
        ...
        ## defining the active edge for the reference signal.
        ACTIVEDGE RISE;
        ## define the reference signal transitions for which
        ## functionality is to be tested.
        TRANS 0-1-X, 1-0-Z;
    END REF
    ## define the control signal and its description.
    DEFINE CTRL WEN
        ...
        ACTIVEDGE RISE; SIZE 1; ACTIVE 0;
        ## mention the values for which the signal
        ## functionality has to be tested.
        TESTASLO X, Z; TRANS 0-X, 0-Z; ...
    END CTRL
    ## define the data signal and its description.
    DEFINE DATA D
        ...
        SIZE DBITS; ACTIVEDGE RISE;
        ## mention the values for which the signal
        ## functionality has to be tested.
        TESTALSO Z, X; TRANS 0-X, Z-0; ...
    END DATA
    ## define the address signal and its description.
    DEFINE ADDR A
        ...
        ACTIVEDGE RISE; SIZE ABITS;
        ## mention the values for which the signal
        ## functionality has to be tested.
        TESTALSO 0X01; TRANS 0001-ZZZZ, 0001-0X0X; ...
    END ADDR
    ## end of write cycle block.
END WRITE_CYCLE
defining the read cycle block. We mention the
signals and its description.
BEGIN READ_CYCLE
    ## if the memory is synchronous the reference signal
    ## is defined.
    DEFINE REF CK
        ...
        ## defining the active edge for the reference signal.
        ACTIVEDGE RISE;
        ## define the reference signal transitions for which
        ## functionality is to be tested.
        TRANS 0-1-X, 1-0-Z;
    END REF
    ## define the control signal and its description.
    DEFINE CTRL WEN
        ...
        ACTIVEDGE RISE; SIZE 1; ACTIVE 1;
        ## mention the values for which the signal
        ## functionality has to be tested.
        TESTASLO X, Z; TRANS 1-X, 1-Z; ...
    END CTRL
    ## define the output control signal and its
    ## description.
    DEFINE OCTRL OEN
        ...
        SIZE 1; ACTIVE 0;
        ## mention the values for which the signal
        ## functionality has to be tested.
        TESTALSO 1, Z, X; TRANS 0-X, 0-1; ...
    END OCTRL
    ## define the address signal and its description.
    DEFINE ADDR A
        ...
        ACTIVEDGE RISE; SIZE ABITS;
        ## mention the values for which the signal
        ## functionality has to be tested.
        TESTALSO 0X01; TRANS 0001-XXXX, 0001-0X0X; ...
    END ADDR
    ## define the output signal and its description.
    DEFINE OUTP Q
        ...
        SIZE DBITS; ACTIVEDGE RISE; ...
    END OUTP
    ## end of read cycle block.
```

```
                END READ_CYCLE
                BEGIN BEHAVIOR
                    ...
                    ## memory gets corrupted if any or all conditions
                    ## defined in the block is true.
                    DEFINE CORRUPT_ENTIRE_MEM
                    WHEN
                        ## for any cycle supported by the memory if the
                        ## control signal named CSN goes X or Z.
                            ALL_CYCLES CTRL CSN X/Z;
                        ## for any cycle supported by the memory if the
                        ## control signal named CSN shows a setup or hold
                        ## violation.
                            ALL_CYCLES CTRL CSN SETUP/HOLD;
                        ## for write cycle if the address signal named A
                        ## becomes unknown or partially unknown.
                            WRITE_CYCLE ADDR A X/P;
                    END DEFINE
                    ## The output port shows Z if any or all conditions
                    ## defined in the block are true.
                    DEFINE PORT_HIZ
                    WHEN
                        ## for any cycle supported by the memory if the
                output
                        ## control signal named OEN goes 1.
                            ALL_CYCLES OCTRL OEN IS 1;
                    END DEFINE
                    ...
                END BEHAVIOR
```

Going now back to algorithm 250, the basic function of the algorithm is to read the template file and store the relevant data in an array, so as to simply access for later processing. At the same time, the format and error checking for the template file is performed.

The storing of information is based on a hierarchical model based on a tree structure describing the organization of the internal data structure and spread on different levels.

All the information related to the memory model is stored at level 1. Such information refers to: "model name", "library name", "memory type" and "number of ports".

Data concerning each port is stored at level 2, wherein each port block includes one or more cycle blocks and one behavior block, as shown in FIGS. 4a-4h.

Level 3 stores data related to each of the cycles, which data includes information on a plurality of signals.

The behavioral block of data stores three types of information: the normal behavior description for each cycle; information for memory violations; information for port violations.

Level 4 stores data for each signal, including Size, Activedge, Trans, TestAlso, Timing and so on.

Figure 7:
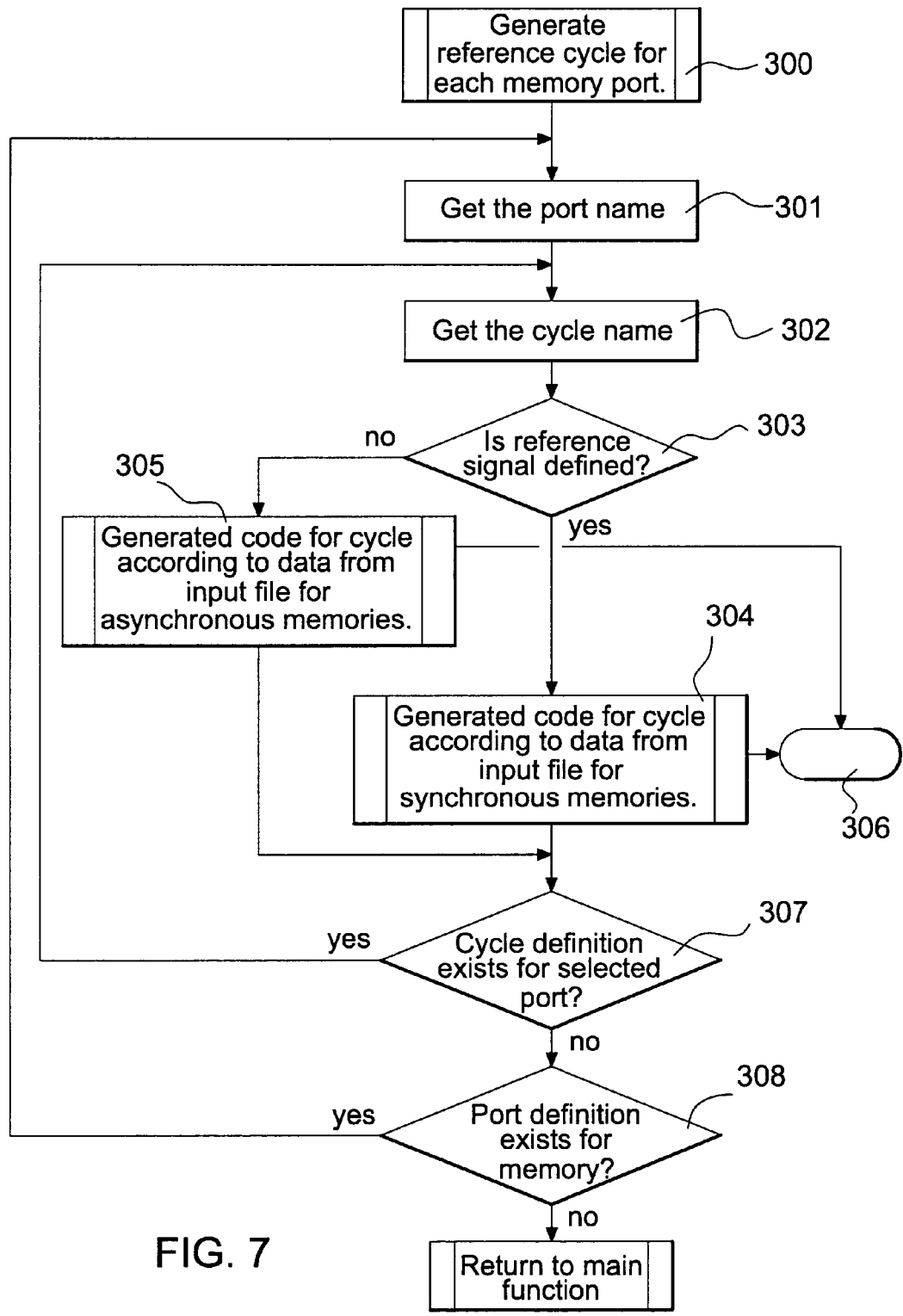
FIG. 7 is a data flow diagram showing an algorithm for generating reference memory cycles.

FIG. 7 is a data flow diagram illustrating algorithm 300, according to which reference memory cycles are generated. The basic idea behind this function is to generate the Verilog code for cycles whose behavior has been described in the input template file 21, and takes into account that the file, as already explained, is structured in a hierarchical manner and contains information for cycles in each memory port. Verilog code for each cycle of the port is laid down in an output file.

Referring to FIG. 7, the first port name in the memory model is retrieved at step 301.

At step 302, the first cycle name is fetched and a check is performed at step 303 to verify whether a reference signal is defined for that cycle.

If so, Verilog code for cycles generated using data from input file for synchronous memories is added to output file 306 at step 304, otherwise Verilog code for cycles generated using data from input file for asynchronous memories is adapted at step 305.

At step 307, the generator checks whether a further cycle definition exists for the selected port and, if so, loops back to step 302.

When the inner loop terminates, the generator checks (step 308) whether the port definition exists for the memory under test and, if so, loops back to step 302. The outer loop is then quit and the generator returns to its main function.

The output file 306 contains the reference cycle definitions for both synchronous and asynchronous memories. In the case of asynchronous memories, cycles related to timing checks are not needed, hence not coded, in that no reference signal obviously exists.

On the contrary, in the case of synchronous memories, the reference signal is a key player, so that the Verilog code for pulse width low (PWL), pulse width high (PLH) and period checks are all defined. All the information needed to code the reference cycle is again obtained from the input template file 21.

Referring to the generator's design strategy, it is possible for the user to define the behavior of the cycle, which, as shown, is described in the behavioral block of the input template file 21. Samples in pseudo-code follow, one concerning synchronous memory and one concerning asynchronous memory, to better clarify how behavior data is entered in the template file 21:

```
    // The cycle definition is within the task block of
    // the Verilog.
    task <name of the cycle>;
    // All the input parameters and register
declaration
    // is set at the beginning of the task. A given
    // reference signal can be described using five 8-
bit
    // characters, for example, 0-1-0, 0-1-x. To take
the
    // reference signal value as input, an input
    // parameter which is 40-bit long must be defined.
    input [8*5-1:0] value;
    // an input parameter storing timing information
    // related to pwl, pwh or period has to be 32-bit
    // long.
    input [31:0] t_time;
    // A reference signal makes three transitions. For
    // example, 0-1-x. To store each value we need to
    // declare registers, first=0, second=1 and
third=x.
    // reg first, second, third; other temporary
    // variables/registers can be declared on need.
    ...
    // Beginning of the task declaration.
    begin
    // The generator supports generation of reference
    // signal with valid values (0, 1) or others.
    // To generate a normal reference transitions, the
    // input parameter "value" equals NORM, else it is
    // specified as "V-V-V", where "V" can be 0, 1, x,
z
        if ( value equals "NORM" )
        then
        // Registers "first", "second" and "third" will
hold
        // reference signal transition states.
        first = active value of reference signal (one can
        obtain from the input file.)
        second = not of first
        third = first
        else
        // In this case the second case holds true (V-V-V),
        // where "V" can be [01XxZz]. Here, the first is
```

-continued

```
    // stored at bits 39:32, the second at bits 23:16
and
    // third at bits 7:0, where the other bits store
the
    // character "—".
    ...
    endif
    // separate reference cycles are generated for each
    // type of timing checks —pwl, pwh, period and
    // normal.
        if ( reference cycle type equals "PWL" )
    // code to check for pulse width low violation when
    // the reference signal makes a transition from
high
    // state to low.
        ...
        else if ( reference cycle type equals "PWH" )
    // code to check for pulse width high violation
when
    // the reference signal makes a transition from low
    // state to high.
        ...
        else if (reference cycle type equals "PER" )
    // code to check for period violation
        ...
        else
    // the normal cycle code with out any violation,
the
    // reference signal changes its value at each step.
        ...
        endif
        end
    // end of the task declaration.
    endtask
```

With regard to asynchronous memory, a signal value can trigger a cycle. This signal is defined in the input file. To explain the Verilog code generated by the generator for different cycles, the following the pseudo code is provided:

```
    // The cycle definition is within the task block
of
    // the Verilog.
    task <name of the cycle>;
    // other temporary variables/registers can be
declared
    // on need.
    ...
    // Beginning of the task declaration.
        begin
            #$STEP;
                #$STEP <signal assigned the new value
(transition)>;
            #$STEP;
        end
    // end of the task declaration.
    endtask
```

Figure 8:
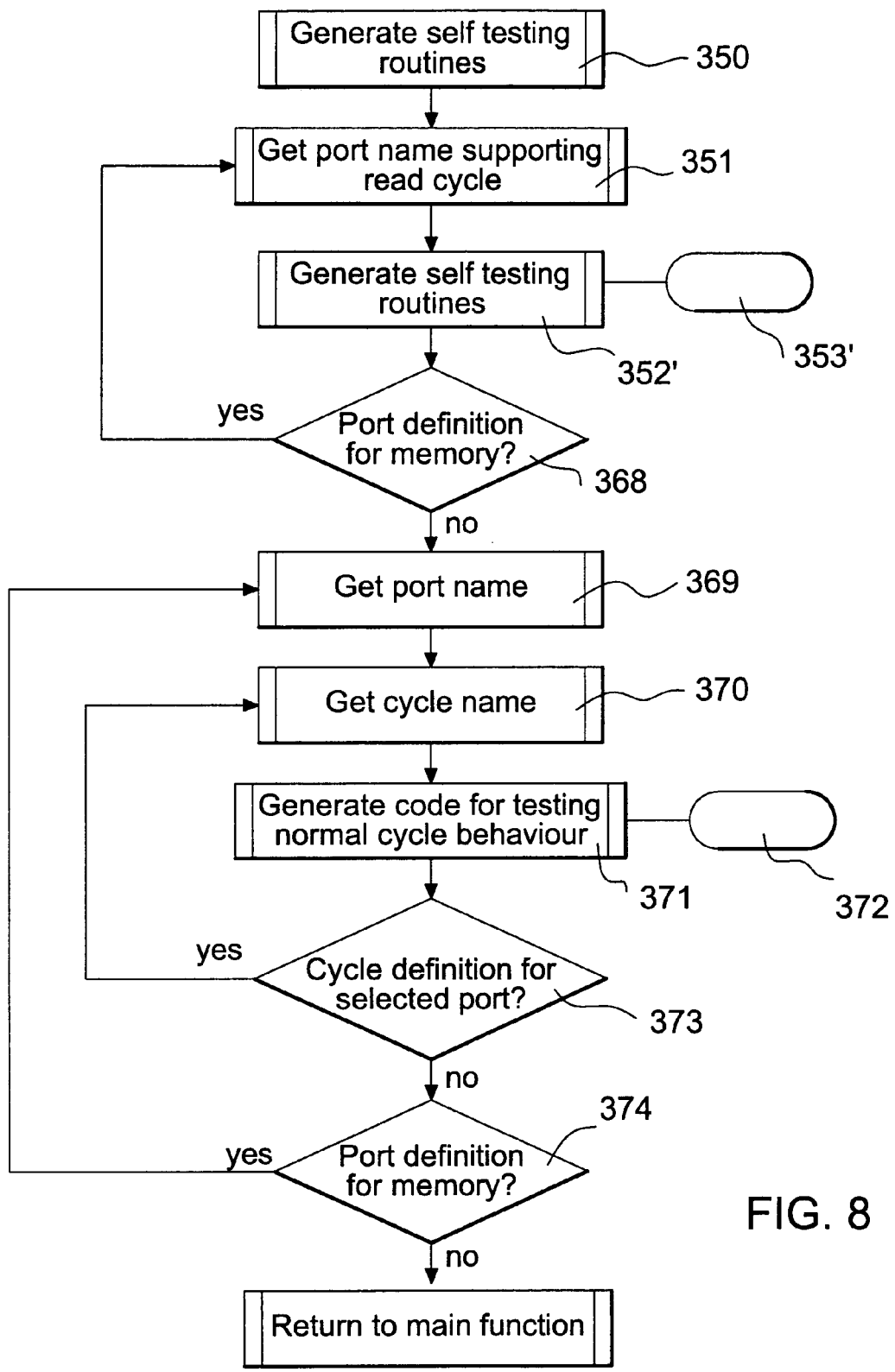
FIG. 8 is a data flow diagram showing an algorithm for generating self testing routines.

FIG. 8 shows the algorithm 350 for generating self-testing routines. The algorithm is in charge of generating the Verilog code that contains routines to test the behavior of the memory, such as corrupt entire memory, corrupt latched location, port unknown, and the like. The Verilog code is written to an output file. Each port has an explicitly declared routine for it, as the behavioral checks are cycle independent.

At step 351, the port name supporting a read cycle is read. At Step 352' Verilog code for performing specific memory testing is written to file, according to a corresponding algorithm 353'.

Figure 9:
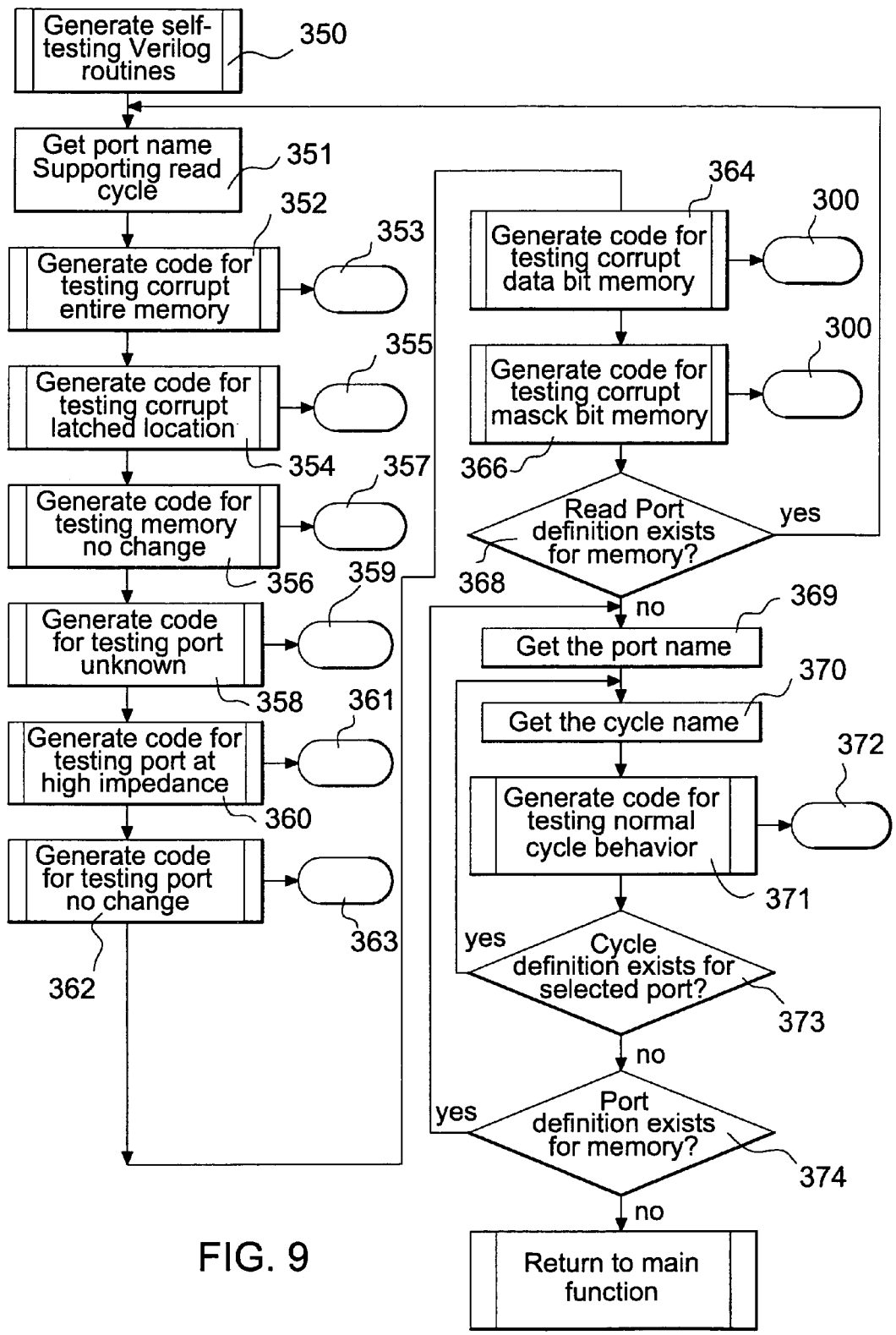
FIG. 9 is an exploded version of the data flow diagram of FIG. 8, showing an algorithm for generating self testing routines in a preferred embodiment.

The data flow diagram is exploded in FIG. 9, where it is shown that the memory test bench includes tests concerning corruption of entire memory, corruption of latched locations, memory when no change occurs, unknown ports, ports at high impedance, ports when no change occurs, corruption of data bits in memory and corruption of a mask bit in memory.

At step 368 the algorithm checks whether a next Read Port definition exists for the type of memory under test. If so, the flow loops back to step 351, otherwise goes on to steps 369 and 370, where the port name is first read, followed by the cycle name. The Verilog code for testing normal cycle behavior is then generated and written to the output file (step 371), according to algorithm 372.

The basic functionality for testing the memory behavior is coded in the behavior block of the input Template file 21, to compare the output at the port with the expected output.

If a cycle definition exists (step 373) for the selected port, the flow loops back to step 369, otherwise it is checked whether a port definition exists (step 374) for the memory under test, in which case the flow goes back to step 369.

In the exploded data flow diagram of FIG. 9, which relates to a preferred embodiment, each of steps 352, 354, 356, 358, 360, 364 and 366 refers to a specific test, which is generated to a corresponding algorithm 353, 355, 357, 359, 361, 363, and 300.

Test 352 and Algorithm 353 tests for corrupt entire memory, and generates Verilog code to force a read cycle on the port under test. If the data at all locations equals unknown ("X" value), then it is assumed that the entire memory has been corrupted. Otherwise, a statement to flash a message in a report file is written.

Test 354 and Algorithm 355 tests for corrupt latched location (M-4.2) and generates Verilog code to force a read cycle on the address location that can be corrupted due to a violation. If the data at that location (address) equals unknown, then it is assumed that the latched location has been corrupted, else a statement to flash a message in the report file is written.

Test 356 and Algorithm 357 tests for memory no change and generates Verilog code to force a read cycle on all address locations. If the data at all locations (addresses) equals its previous value, then it is assumed that the data at memory locations has not been changed, otherwise a statement to flash a message in the report file is written.

Test 358 and Algorithm 359 tests for port unknown. Whenever the task is invoked, it checks if the output port is unknown, else a statement to flash an error message in the report file is generated.

Test 360 and Algorithm 361 is suitable for testing a port at high impedance. Whenever the task is invoked, it checks if the output port is set to "Z", else a statement to flash an error message in the report file is generated.

Test 362 and Algorithm 363 tests for port no change. Whenever the task is invoked, it checks if the output port is showing the previous data, else a statement to flash an error message in the report file is generated.

Test 364 and Algorithm 300 tests for corrupt data bit memory. In case of certain signal violations, some bits of the data are corrupted. To check for such cases, it is first needed to find what value is expected at the output port and a read cycle is forced at the specified memory address and finally the output at the port is compared with the calculated value. If the two values do not match, a statement to flash an error message is generated in the report file.

Test 366 and Algorithm 300 tests for corrupt mask bit for memory. In case of certain signal violations, some bits of the mask are corrupted. To check for such cases, it is first needed to know what value is expected at the output port, then a read cycle is forced at the specified memory address and finally the output at the port is compared with the calculated value. If the two values do not match, a statement to flash an error message in the report file is written.

Going back to the data flow diagram of FIG. 2, algorithm 400 generates tasks to write valid data onto memory. The aim of this function is to generate Verilog code for tasks that can force a write cycle onto memory addresses, the generator being knowledgeable about what data has been stored. These tasks are mainly used for writing self-checking routines, as the generator has the knowledge about the expected output, each time a test case is simulated.

Different tasks exist for each separate port. In addition, the number of memory locations that will be written depends upon the TWORDS variable, which is set by the designer.

The following is an example in pseudo code to better clarify the algorithm:

```
task SetMemContents;
// Setting (Writing) the memory contents. declare
// input parameters
...
begin
 for ( i=0; i<number of TWORDS; i++ )
 begin
  // at location i, data written to memory is also
  // that is Address=1, Data=1.
  write cycle invoked at address i (data=i);
 end
end
endtask
```

Supposing that TWORDS is set to "5", the memory contents in the different steps will be: Address=0, Data=0; Address=1, Data=1; Address=2, Data=2; Address=3, Data=3; Address=4, Data=4.

Algorithm 450 generates tasks to read data from memory. The aim of this function is to generate Verilog code for a task that can force a read cycle onto a memory address, and is explained by the following pseudo-code. Tasks exist for each separate port. In addition, the number of memory locations that will be read depends on the TWORDS variable, which is set by the designer. The code is:

```
task GetMemContents;
// Get (Reading) the memory contents. Declare input
// parameters
...
begin
 for ( i=0; i<number of TWORDS; i++ )
 begin
  // under ideal conditions, at location i, output
  // equals i, that is Address=1, Data=1, Output=i.
  read cycle invoked at address i;
 end
end
endtask
```

Under ideal conditions, when a legal operation has been performed on the memory, and supposing that TWORDS is set to "5", the expected result when the GetMemContents task is invoked will be: Address=0, Data=0, Output=0; Address=1, Data=1, Output=1; Address=2, Data=2, Output=2; Address=3, Data=3, Output=3; Address=4, Data=4, Output=4.

Algorithm 500 makes calls to self-testing tasks. The behavioral section of the input or template file defines the signal conditions for which the memory behaves in a abnormal manner and hence self-checking routines need to be invoked. Such a function encodes the data from input file into Verilog language so that the self-checking tasks can be invoked.

For instance, on a single port memory supporting write cycle and read cycle only, the behavioral block of the input template file could be as follows.

The function accesses information from the data structure created while parsing the input file, and for each cycle in each port, the codes are converted into Verilog code and written to an output file. The code is:

```
// self testing task for write cycle
task <name of the task
"callSelfTestingForWriteCycle">;
 // input parameter declaration
 ...
 flagTest=1;
 // all the conditions as mentioned in the input
file.
  // if any one of the condition is true then self
  // testing task has to be called.
  if ( CSN equals X "or"
  CSN equals Z "or"
  CSN shows setup violation "or"
  CSN shows hold violation "or"
  A equals X "or" A equals P )
  then
   // call to task for checking if the entire memory
has
   // been corrupted.
   checkForCorruptEntireMemeory;
   // if the memory behavior has been tested once then
   // the normal operation of the cycle is not
required
   // to be checked, hence the flag is set to false.
   flagTest = 0;
  end if
  if ( flagTest )
   // if none of the above checks were done to test
the
   // memory behavior, call to task for checking if
write
   // cycle was normal.
   checkForNormalWriteCycle;
  endif
endtask
// self testing task for read cycle
task   <name   of   the   task
"callSelfTestingForReadCycle">;
 // input parameter declaration
 ...
 flagTest=1;
 // all the conditions as mentioned in the input
file.
  // if any one of the condition is true then self
  // testing task has to be called.
  if ( CSN equals X "or"
  CSN equals Z "or"
  CSN shows setup violation "or"
  CSN shows hold violation )
  then
   // call to task for checking if the entire memory
has
   // been corrupted.
   checkForCorruptEntireMemeory;
   // if the memory behavior has been tested once then
   // the normal operation of the cycle is not
required
   // to be checked, hence the flag is set to false.
   flagTest=0;
  end if
  if ( OEN equals 1 )
  then
   // call to task for checking if the output port
reads
   // Z.
   checkForPortZ;
```

```
        // if the memory behavior has been tested once then
        // the normal operation of the cycle is not
required
        // to be checked, hence the flag is set to false.
            flagTest = 0;
        endif
        if ( flagTest )
        // if none of the above checks were done to test
the
        // memory behavior, call to task for checking if
read
        // cycle was normal.
            checkForNormalReadCycle;
        endif
    endtask
```

Figure 10:
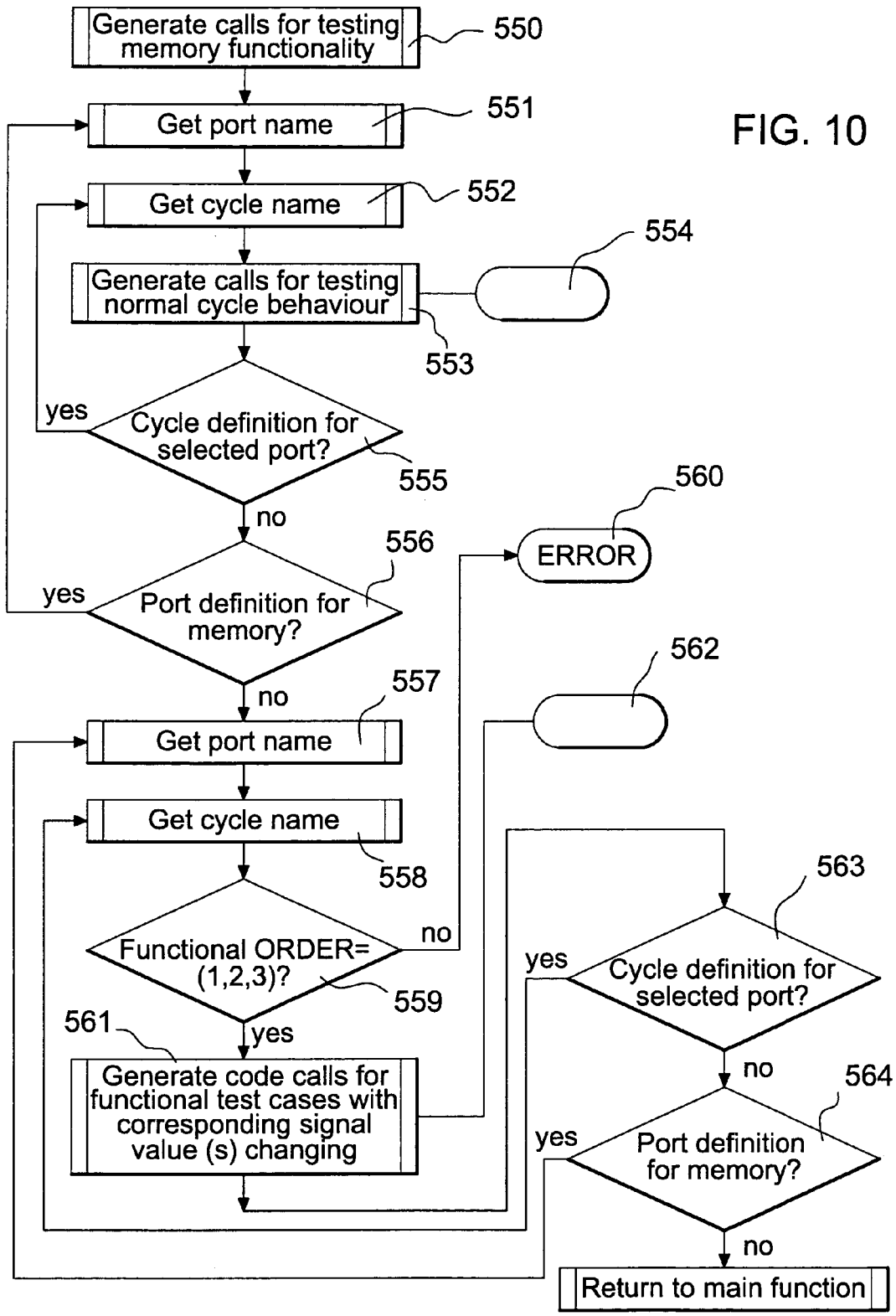
FIG. 10 is a data flow diagram showing an algorithm for instantiating functional test cases.

Algorithm 550, which is shown in FIG. 10, instantiates calls for functional test cases.

The "TESTALSO" statement in the input or template file defines the condition for which each signal has to be tested. Such tests fall under the functional test category. In addition, it is possible to define the ORDER of the functional tests ("1", "2", "3").

At steps 551 and 552 first the port name, then the cycle name is read, and at step 553 the Verilog code for functionality testing of memory is generated in accordance with algorithm 554.

At step 555 it is checked whether a cycle definition exists for the selected port, in which case the flow loops back to step 552. Otherwise, at step 556 it is checked whether a port definition exists for the memory under test, in which case the flow loops back to step 551.

Once this first loop is terminated, a second loop is started at step 557 by reading again the port name and, at step 558, the cycle name.

If the functional ORDER is set to a value comprised between "1" and "3" (step 559), the Verilog calls to functional test cases with a corresponding signal value or values changing (1, 2 or 3) are generated at step 561, in accordance algorithm 562, and the flow jumps to step 563.

If the functional ORDER value is invalid, an error occurs at step 560 and the flow comes to an end.

At step 563 it is checked whether a further cycle definition exists for the selected port, in which case a jump is made back to step 558, otherwise a jump is made from step 564 to step 557 in the case that a further port definition exists for the memory under test.

Algorithm 562 to write calls for the functional test cases is now explained through illustrative examples, supposing that a single port memory, which supports read and write cycles, is used.

The function accesses the above information from the data structure created while parsing the input template file. The information is then coded to get the functional test cases and written to an output file.

The following code refers to a Functional test with ORDER=1:

```
    // functional testing routines for write cycle.
    For
        // order=1, only one signal value keeps changing
    while
        // other signals equal to their active values.
        task <name of the task "CallsToWriteCycle">;
        begin
```

```
        // call to write cycle when all the signals take
legal
        // values. reference signal CK=NORM, control signal
        // WEN=0, address A=0 and data D=0.
        // functionalTestWriteCycleCall ( CK, WEN, A, D );
            functionalTestWriteCycleCall ( "NORM", 1'b0, 4'b0,
6'b0 );
        // now we take the other values of the signal and
        // invoke calls. call for reference signal CK.
            functionalTestWriteCycleCall ( "0-1-x", 1'b0, 4'b0,
6'b0 );
            functionalTestWriteCycleCall ( "1-0-z", 1'b0, 4'b0,
6'b0 );
        // call for control signal WEN.
            functionalTestWriteCycleCall ( "NORM", 1'bx, 4'b0,
6'b0 );
            functionalTestWriteCycleCall ( "NORM", 1'bz, 4'b0,
6'b0 );
        // call for data bus D.
            functionalTestWriteCycleCall ( "NORM", 1'b0, 4'b0,
6'bz );
            functionalTestWriteCycleCall ( "NORM", 1'b0, 4'b0,
6'bx );
        // call for address bus A.
            functionalTestWriteCycleCall ( "NORM", 1'b0,
4'b0x01, 6'b0 );
        end
    endtask
    // functional testing routines for read cycle.
    task <name of the task "CallsToReadCycle">;
    begin
        // call to write cycle when all the signals take
legal
        // values. reference signal CK=NORM, control
signal
        // WEN=0, output control signal OEN=0 and address
A=0.
        // functionalTestWriteCycleCall ( CK, WEN, OEN, A
);
            functionalTestReadCycleCall ( "NORM", 1'b1, 1'b0,
4'b0 );
        // now we take the other values of the signal and
        // invoke calls. call for reference signal CK.
            functionalTestReadCycleCall ( "0-1-x", 1'b1, 1'b0,
4'b0 );
            functionalTestReadCycleCall ( "1-0-z", 1'b1, 1'b0,
4'b0 );
        // call for control signal WEN.
            functionalTestReadCycleCall ( "NORM", 1'bx, 1'b0,
4'b0 );
            functionalTestReadCycleCall ( "NORM", 1'bz, 1'b0,
4'b0 );
        // call for output control signal OEN.
            functionalTestReadCycleCall ( "NORM", 1'b1, 1'b1,
4'b0 );
            functionalTestReadCycleCall ( "NORM", 1'b1, 1'bx,
4'b0 );
            functionalTestReadCycleCall ( "NORM", 1'b1, 1'bz,
4'b0 );
        // call for address bus A.
            functionalTestReadCycleCall ( "NORM", 1'b1, 1'b0,
4'b0x01);
        end
    endtask
```

The same applies to other cycles supported by the memory.

The following code refers to a Functional test with ORDER=2:

```
    // functional testing routines for write cycle.
    For
        // order=2, signal value keeps changing for 2
    signals
        // while other signals equal to their active
    values.
```

```
        task <name of the task "CallsToWriteCycle">;
        begin
            // call to write cycle when all the signals take legal
            // values. reference signal CK=NORM, control signal
            // WEN=0, address A=0 and data D=0.
            // functionalTestWriteCycleCall ( CK, WEN, A, D );
            functionalTestWriteCycleCall ( "NORM", 1'b0, 4'b0, 6'b0 );
            // now we take the other values of the signal and
            // invoke calls. call for CK & WEN.
            functionalTestWriteCycleCall ( "0-1-x", 1'bx, 4'b0, 6'b0 );
            functionalTestWriteCycleCall ( "0-1-x", 1'bz, 4'b0, 6'b0 );
            functionalTestWriteCycleCall ( "1-0-z", 1'bx, 4'b0, 6'b0 );
            functionalTestWriteCycleCall ( "1-0-z", 1'bz, 4'b0, 6'b0 );
            // call for CK & D.
            functionalTestWriteCycleCall ( "0-1-x", 1'b0, 4'b0, 6'bz );
            functionalTestWriteCycleCall ( "0-1-x", 1'b0, 4'b0, 6'bx );
            functionalTestWriteCycleCall ( "1-0-z", 1'b0, 4'b0, 6'bz );
            functionalTestWriteCycleCall ( "1-0-z", 1'b0, 4'b0, 6'bx );
            // call for CK & A.
            functionalTestWriteCycleCall ( "0-1-x", 1'b0, 4'b0x01, 6'b0 );
            functionalTestWriteCycleCall ( "1-0-z", 1'b0, 4'b0x01, 6'b0 );
            // call for WEN & D
            functionalTestWriteCycleCall ( "NORM", 1'bx, 4'b0, 6'bz );
            functionalTestWriteCycleCall ( "NORM", 1'bx, 4'b0, 6'bx );
            functionalTestWriteCycleCall ( "NORM", 1'bz, 4'b0, 6'bz );
            functionalTestWriteCycleCall ( "NORM", 1'bz, 4'b0, 6'bx );
            // call for WEN & A
            functionalTestWriteCycleCall ( "NORM", 1'bx, 4'b0x01, 6'b0 );
            functionalTestWriteCycleCall ( "NORM", 1'bz, 4'b0x01, 6'b0 );
            // call for D & A
            functionalTestWriteCycleCall ( "NORM", 1'b0, 4'b0x01, 6'bz );
            functionalTestWriteCycleCall ( "NORM", 1'b0, 4'b0x01, 6'bx );
        end
        endtask
```

The same applies to other cycles supported by the memory.

The following code refers to a Functional test with ORDER=3:

```
        // functional testing routines for write cycle. For
        // order=3, signal value keeps changing for 3 signals
        // while other signals equal to their active values.
        task <name of the task "CallsToWriteCycle">;
        begin
            // call to write cycle when all the signals take legal
            // values. reference signal CK=NORM, control signal
            // WEN=0 and data D=0.
            // functionalTestWriteCycleCall ( CK, WEN, A, D );
            functionalTestWriteCycleCall ( "NORM", 1'b0, 4'b0, 6'b0 );
            // take the other values of the signal and invoke
            // calls. call for CK & WEN & D.
            functionalTestWriteCycleCall ( "0-1-x", 1'bx, 4'b0, 6'bz );
            functionalTestWriteCycleCall ( "0-1-x", 1'bx, 4'b0, 6'bx );
            functionalTestWriteCycleCall ( "0-1-x", 1'bz, 4'b0, 6'bz );
            functionalTestWriteCycleCall ( "0-1-x", 1'bz, 4'b0, 6'bx );
            functionalTestWriteCycleCall ( "1-0-z", 1'bx, 4'b0, 6'bz );
            functionalTestWriteCycleCall ( "1-0-z", 1'bx, 4'b0, 6'bx );
            functionalTestWriteCycleCall ( "1-0-z", 1'bz, 4'b0, 6'bz );
            functionalTestWriteCycleCall ( "1-0-z", 1'bz, 4'b0, 6'bx );
            // call for CK & WEN & A.
            functionalTestWriteCycleCall ( "0-1-x", 1'bx, 4'b0x01, 6'b0 );
            functionalTestWriteCycleCall ( "0-1-x", 1'bz, 4'b0x01, 6'b0 );
            functionalTestWriteCycleCall ( "1-0-z", 1'bx, 4'b0x01, 6'b0 );
            functionalTestWriteCycleCall ( "1-0-z", 1'bz, 4'b0x01, 6'b0 );
            // call for WEN & D & A.
            functionalTestWriteCycleCall ( "NORM", 1'bx, 4'b0x01, 6'bz );
            functionalTestWriteCycleCall ( "NORM", 1'bx, 4'b0x01, 6'bx );
            functionalTestWriteCycleCall ( "NORM", 1'bz, 4'b0x01, 6'bz );
            functionalTestWriteCycleCall ( "NORM", 1'bz, 4'b0x01, 6'bx );
        end
        endtask
```

The same applies to other cycles supported by the memory.

The above pseudo code illustrates how different types of functional test cases can be called. The basic operation is to force the cycle to occur and then perform a self-check on the memory, so as to report errors, if any, in a report file.

The following pseudo code is useful to understand the task calls, and refers to the previous example for a write cycle:

```
        // entire functional test case is written.
        task <name of task "functionalTestWriteCycleCall">;
        // declare all the input parameters to store the signal
        // values as passed from the task "CallsToWriteCycle".
        ...
        begin
            SetMemContents;
            // Reset the memory contents to known values
            // Initialize all the signals for write cycle to the
            // values passed as parameters from "CallsToWriteCycle"
            // task.
            SetSignalValues;
            WriteCycle;
            // invoke the write cycle
            callSelfTestingForWriteCycle;
            // invoke the self testing tasks
            GetMemContents
            // Read the contents of the memory, after each test
            // completion.
        end
        endtask
```

The same applies to other cycles supported by the memory.

Figure 11:
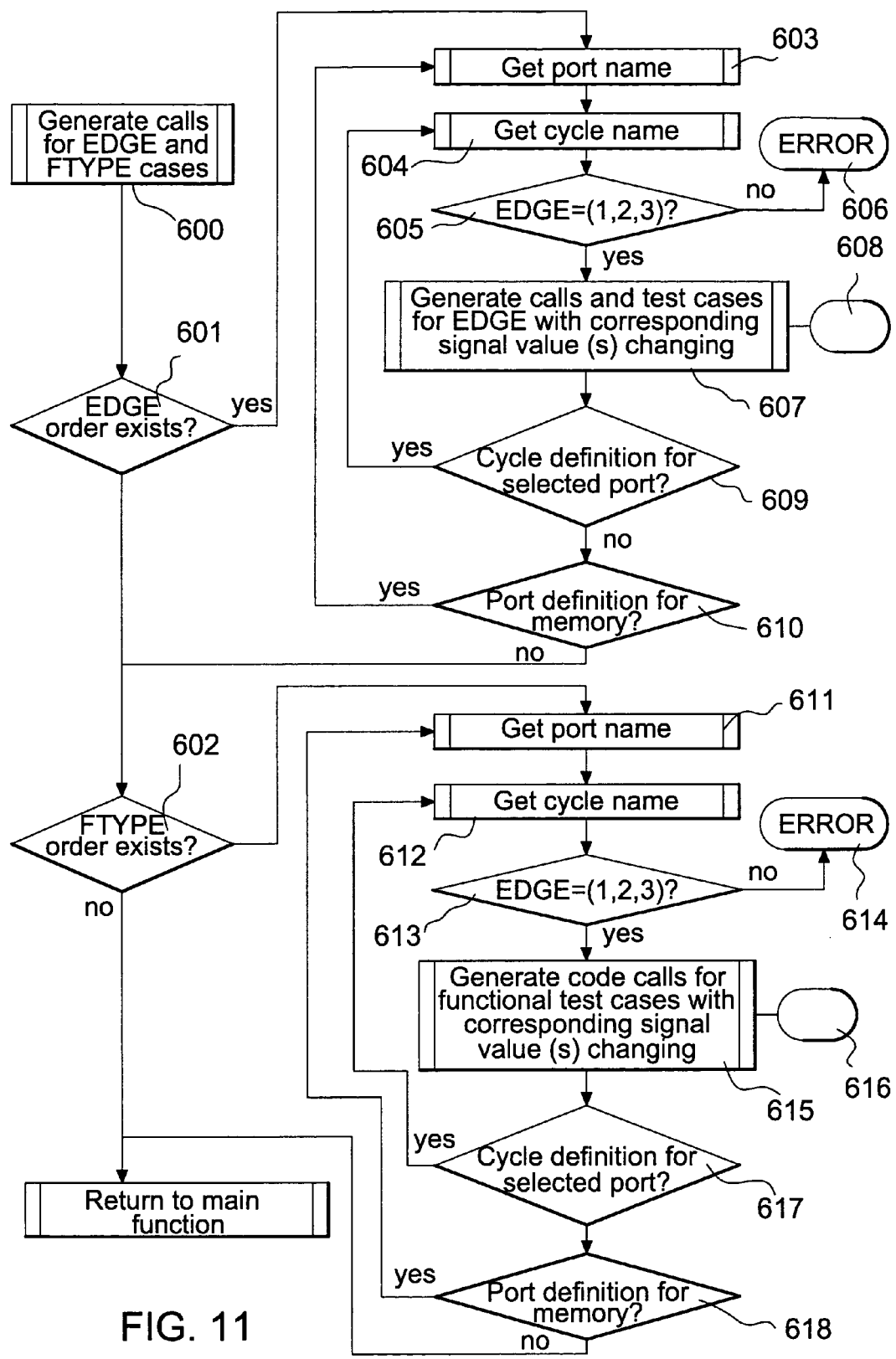
FIG. 11 is a data flow diagram showing an algorithm for instantiating calls for edge and ftype test cases.

Algorithm 600, shown in FIG. 11, instantiates calls for edge/ftype type test cases.

If the designer has included arguments to generate test cases for Edge and Ftype by selecting an order ("1", "2", "3") then a corresponding function is called, in a way which is similar to the functional test cases algorithm. Both the Edge and Ftype test cases exist for only synchronous memories. The number of signals whose value changes is decided by the order stored in "EDGE" and "FTYPE" variables. The signal values are taken from the "TRANS" statement defined in the signal description block of the input template file.

With referral to FIG. 11, at step 601 a check is made to verify whether an "EDGE" order exists. In that case, functions to generate edge type cases are executed, before moving on to step 602.

At step 603 the port name is read, then the cycle name at step 604. If, at step 605, the EDGE value is comprised between "1" and "3", then the Verilog code to generate calls and test cases for EDGE with one, two or three signals changing is accordingly generated at step 607 according to algorithm 608, otherwise an error occurs (step 606).

At step 609 it is checked whether a cycle definition exists for the selected port, in which case the flow loops back to step 604. Otherwise, at step 610 it is checked whether a port definition exists for the memory under test, in which case the flow loops back to step 603.

When no more port definitions exist for the memory under test, or if no EDGE order was defined, the flow branches to step 602, where the same operations are performed with regard to FTYPE orders.

Particularly, at step 611 the port name is read, then the cycle named at step 612. If, at step 613, the FTYPE value is comprised between "1," and "3", then the Verilog code to generate calls and test cases for FTYPE with one, two or three signals changing is accordingly generated at step 615 according to algorithm 616, otherwise an error occurs (step 614).

At step 617 it is checked whether a cycle definition exists for the selected port, in which case the flow loops back to step 612. Otherwise, at step 618 it is checked whether a port definition exists for the memory under test, in which case the flow loops back to step 611.

Algorithms 608 and 616 to generate calls and test cases for EDGE and FTYPE tests are now clarified through an illustrative example, in which a single port memory supports read and write cycles.

The function accesses such information from the data structure created while parsing the input Template file 21. The information is then coded to get the edge and ftype test cases and written to an output file.

The following three blocks of pseudo-code better clarify this activity:

In the case of "EDGE order=1 && FTYPE order=1"

```
// edge type testing routines for write cycle for
// address bus A, other signals equal to their active
// values.
    task <name of the task
"edgeCallsToWriteCycleForA">;
    begin
    // Call to edge type test for write cycle, where
    // address signal changes its value and other signals
    // take legal values. Reference signal CK=NORM,
    // control signal WEN=0 and data D=0.
```

```
// edgeTestWriteCycleCallForA ( WEN, AFirst, Asecond,
    // D );
    edgeTestWriteCycleCallForA ( 1'b0, 4'b0001, 4'bzzzz, 6'b0 );
    edgeTestWriteCycleCallForA ( 1'b0, 4'b0001, 4'b0x0x, 6'b0 );
    end
    endtask
// ftype type testing routines for write cycle for
// address bus A, other signals equal to their active
// values.
    task <name of the task
"ftypeCallsToWriteCycleForA">;
    begin
    // Call to ftype type test for write cycle, where
    // address signal changes its value and other signals
    // take legal values. Reference signal CK=NORM,
    // control signal WEN=0 and data D=0.
    // ftypeTestWriteCycleCallForA ( WEN, AFirst, Asecond,
    // D );
    ftypeTestWriteCycleCallForA ( 1'b0, 4'b0001, 4'bzzzz, 6'b0 );
    ftypeTestWriteCycleCallForA ( 1'b0, 4'b0001, 4'b0x0x, 6'b0 );
    end
    endtask
```

The same applies to other signals defined for each cycle of each port.

The following pseudo code refers to "EDGE order=2 && FTYPE order=2":

```
// edge type testing routines for write cycle. For
// order=2, signal value keeps changing for 2 signals
// while other signals equal to their active values.
    task <name of the task
"edgeCallsToWriteCycleForA_WEN">;
    begin
    // Call to edge type test for write cycle, where
    // address signal and control signal change their
    // values & other signals take legal values.
    // Reference signal CK=NORM, and data D=0.
    // edgeTestWriteCycleCallForA_WEN ( WENFirst,
    // WENSecond, AFirst, ASecond, D );
    edgeTestWriteCycleCallForA_WEN (1'b0, 1'bx, 4'b0001, 4'bzzzz, 6'b0);
    edgeTestWriteCycleCallForA_WEN (1'b0,1'bx,4'b0001,4'b0x0x, 6'b0);
    edgeTestWriteCycleCallForA_WEN (1'b0,1'bz,4'b0001,4'bzzzz, 6'b0);
    edgeTestWriteCycleCallForA_WEN (1'b0, 1'bz, 4'b0001, 4'b0x0x, 6'b0);
    end
    endtask
// ftype type testing routines for write cycle. For
// order=2, signal value keeps changing for 2 signals
// while other signals equal to their active values.
    task <name of the task
"ftypeCallsToWriteCycleForA_WEN">;
    begin
    // Call to ftype type test for write cycle, where
    // address signal and control signal change their
    // values & other signals take legal values.
    // Reference signal CK=NORM, and data D=0.
    // ftypeTestWriteCycleCallForA_WEN ( WENFirst,
    // WENSecond, AFirst, ASecond, D );
```

```
        ftypeTestWriteCycleCallForA_WEN ( 1'b0, 1'bx,
4'b0001, 4'bzzzz, 6'b0 );
        ftypeTestWriteCycleCallForA_WEN ( 1'b0, 1'bx,
4'b0001, 4'b0x0x, 6'b0 );
        ftypeTestWriteCycleCallForA_WEN ( 1'b0, 1'bz,
4'b0001, 4'bzzzz, 6'b0 );
        ftypeTestWriteCycleCallForA_WEN ( 1'b0, 1'bz,
4'b0001, 4'b0x0x, 6'b0 );
    end
endtask
```

The same applies to other signals defined for each cycle of each port.

The following pseudo code refers to "EDGE order=3 && FTYPE order=3":

```
        // edge type testing routines for write cycle. For
        // order=3, signal value keeps changing for 3
signals
        // while other signals equal to their active
values.
    task <name of the task
"edgeCallsToWriteCycleForA_WEN_D">;
        begin
        // Call to edge type test for write cycle, where
        // address signal, control signal and data signal
        // change their values and other signals take legal
        // values. Reference signal CK=NORM.
        // edgeTestWriteCycleCallForA_WEN_D ( WENFirst,
        // WENSecond, AFirst, ASecond, Dfirst, DSecond );
        edgeTestWriteCycleCallForA_WEN_D (1'b0, 1'bx,
4'b0001, 4'bzzzz, 6'b0, 6'bx);
        edgeTestWriteCycleCallForA_WEN_D (1'b0, 1'bx,
4'b0001,4'b0x0x,6'b0, 6'bx);
        edgeTestWriteCycleCallForA_WEN_D (1'b0, 1'bz,
4'b0001,4'bzzzz, 6'b0, 6'bx);
        edgeTestWriteCycleCallForA_WEN_D (1'b0,1'bz,
4'b0001,4'b0x0x, 6'b0, 6'bx);
        edgeTestWriteCycleCallForA_WEN_D (1'b0, 1'bx,
4'b0001,4'bzzzz, 6'bz, 6'b0);
        edgeTestWriteCycleCallForA_WEN_D (1'b0,1'bx,
4'b0001,4'b0x0x, 6'bz, 6'b0);
        edgeTestWriteCycleCallForA_WEN_D
(1'b0,1'bz,4'b0001, 4'bzzzz, 6'bz, 6'b0 );
        edgeTestWriteCycleCallForA_WEN_D (1'b0, 1'bz,
4'b0001,4'b0x0x,6'bz, 6'b0);
    end
endtask
        // ftype type testing routines for write cycle. For
        // order=3, signal value keeps changing for 3
signals
        // while other signals equal to their active
values.
    task <name of the task
"ftypeCallsToWriteCycleForA_WEN_D">;
        begin
        // Call to ftype type test for write cycle, where
        // address signal, control signal and data signal
        // change their values and other signals take legal
        // values. Reference signal CK=NORM.
        // ftypeTestWriteCycleCallForA_WEN_D ( WENFirst,
        // WENSecond, AFirst, ASecond, Dfirst, DSecond );
        ftypeTestWriteCycleCallForA_WEN_D (1'b0, 1'bx,
4'b0001,4'bzzzz, 6'b0, 6'bx);
        ftypeTestWriteCycleCallForA_WEN_D
(1'b0,1'bx,4'b0001,4'b0x0x, 6'b0, 6'bx);
        ftypeTestWriteCycleCallForA_WEN_D
(1'b0,1'bz,4'b0001, 4'bzzzz, 6'b0, 6'bx);
        ftypeTestWriteCycleCallForA_WEN_D (1'b0, 1'bz,
4'b0001,4'b0x0x,6'b0,6'bx );
        ftypeTestWriteCycleCallForA_WEN_D (1'b0,1'bx,
4'b0001,4'bzzzz, 6'bz, 6'b0);
        ftypeTestWriteCycleCallForA_WEN_D (1'b0, 1'bx,
4'b0001,4'b0x0x,6'bz,6'b0 );
        ftypeTestWriteCycleCallForA_WEN_D (1'b0, 1'bz,
4'b0001,4'bzzzz, 6'bz, 6'b0);
        ftypeTestWriteCycleCallForA_WEN_D (1'b0, 1'bz,
4'b0001,4'b0x0x, 6'bz,6'b0 );
    end
endtask
```

The same applies to other signals defined for each cycle of each port.

The above pseudo code shows how different types of edge and ftype type test cases can be called. The basic operation is to force the cycle to occur and then perform the self-check on the memory, so as to finally report errors, if any, in a report file.

The following pseudo code helps understanding the task calls, with reference to the above example, for write cycle and order=1:

```
        // entire edge type test case is written.
        task <name of task "edgeTestWriteCycleCallForA" >;
        // Store signal values passed as input parameters
from
        // the task "edgeCallsToWriteCycleForA".
        input WEN_e;
        input [4-1:0] A_f, A_s;
        input [6-1:0] D_e;
        // declare temporary variables needed to generate
        // clock.
        reg first;
        begin
        // task call to SetMemContents. This is done to
reset
        // the memory contents to known values, to help in
        // self-checking.
        SetMemContents;
        // Initialize all the signals for write cycle to
the
        // values passed as parameter from
        // "edgeCallsToWriteCycleForA" task.
        first=active value of the reference signal.
        $STEP CK=first;
        WEN, D set equal to their active values.
        A=A_f;
        #$STEP CK=~first; A=A_s;
        #$STEP CK=first;
        // invoke the self testing tasks in case of a bug
in
        // memory model error can be checked in a report
file
        callSelfTestingForWriteCycle;
        // task call to GetMemContents. Read the contents
of
        // the memory, after each testcompletion.
        GetMemContents.
        end
        // task declaration ends here.
        endtask
        // entire ftype type test case is written.
        task <name of task "ftypeTestWriteCycleCallForA"
>;
        // Store signal values passed as input parameters
from
        // the task "ftypeCallsToWriteCycleForA".
        input WEN_e;
        input [4-1:0] A_f, A_s;
        input [6-1:0] D_e;
        // declare temporary variables needed to generate
        // clock.
        reg first;
        begin
        // task call to SetMemContents. This is done to
reset
        // the memory contents to known values, to help in
```

```
            // self-checking.
            SetMemContents;
            // Initialize all the signals for write cycle to
      the
            // values passed as parameter from
            // "ftypeCallsToWriteCycleForA" task.
            first=active value of the reference signal.
            #$STEP CK=first;
            WEN, D set equal to their active values.
            A=A_f;
            #$STEP CK=~first;
            #$STEP          A=A_s;
            #$STEP CK=first;
            // invoke the self testing tasks in case of bug in
            // memory model error can be checked in a report
      file
            callSelfTestingForWriteCycle;
            // task call to GetMemContents. Read the contents
      of
            // the memory, after each test completion.
            GetMemContents.
            end
            // task declaration ends here.
            endtask
```

The same applies to other signals for each cycle of each port supported by the memory.

Figure 12:
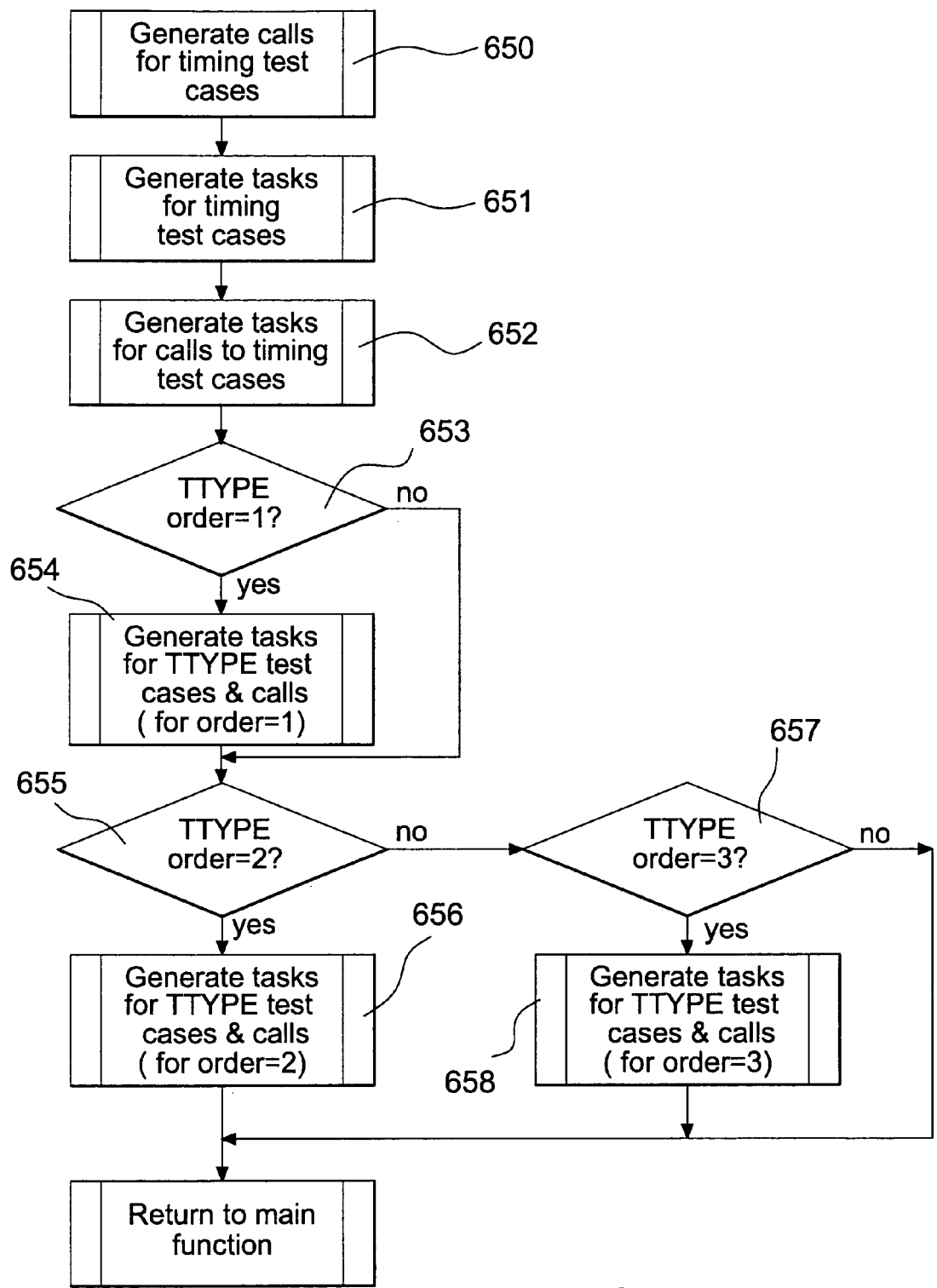
FIG. 12 is a data flow diagram showing an algorithm for timing test cases.

Algorithm 650, shown in FIG. 12, instantiates calls for timing test cases and is used to test the timing conditions such as pulse width low and high time for reference signals, and setup and hold time for other signal types for the memory under test. The "SET" statements in the input template file are used to define the timing values and the "TRANS" statements are used to define the signal transition values. For reference signals, the timing values and clock transitions are specified using the "PER", "PWL", "PWH", "PWLTRANS", "PWHTRANS", and "PERTRANS" statements.

At steps 651-652, Verilog tasks for timing test cases and Verilog tasks for calls to timing test cases are respectively generated.

At steps 653 655 and 657 a check is made to verify whether the "TTYPE" order is comprised between "1" and "3", in which case Verilog tasks for TTYPE test cases of that order and corresponding calls are generated (step 654 656 and 658). Otherwise, an error is reported.

Figure 13:
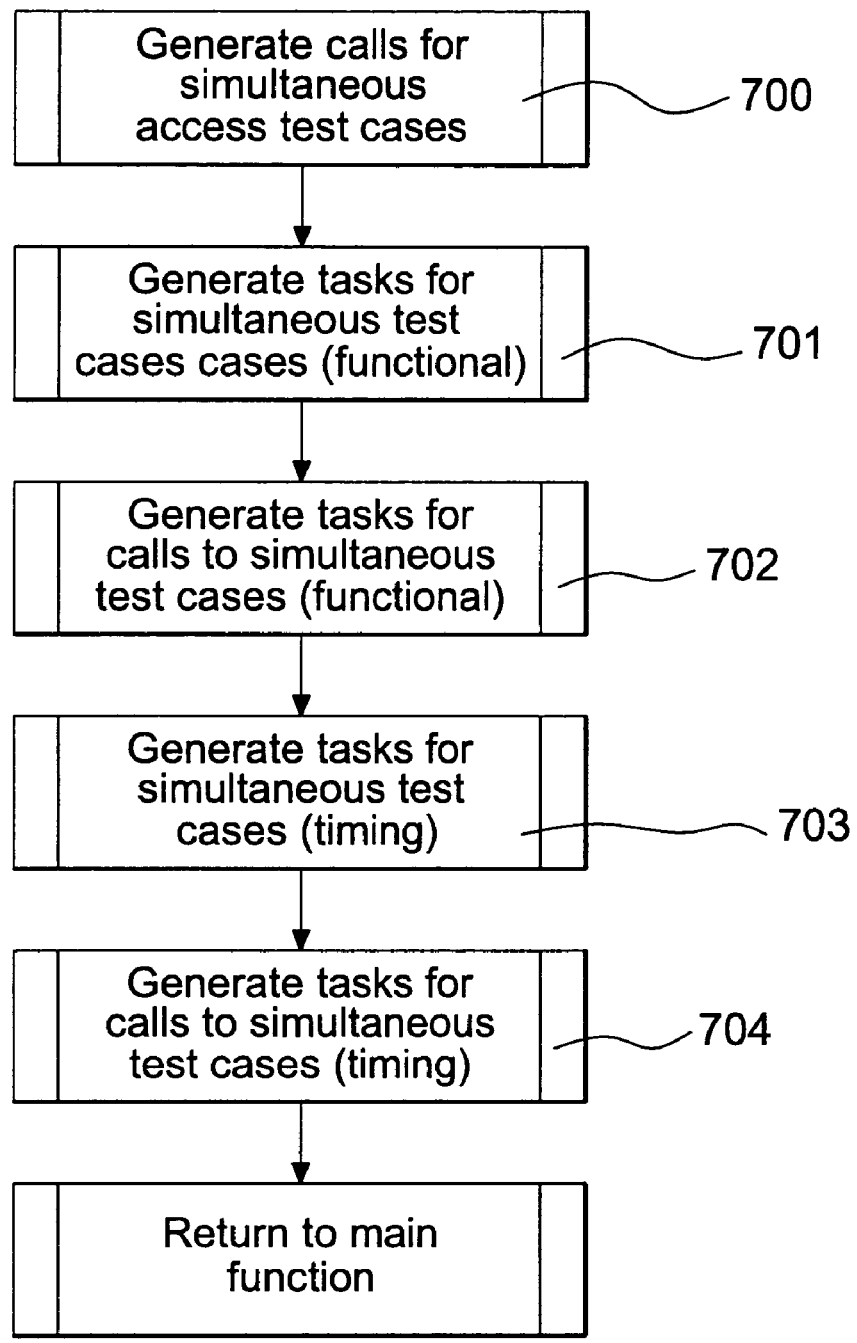
FIG. 13 is a data flow diagram showing an algorithm for instantiating simultaneous access test cases.

Algorithm 700, shown in FIG. 13, instantiates calls for simultaneous access test cases and is used to test the functioning of memories that have more than one port, so that multiple ports are operating simultaneously.

The "CONTENTION" statements in the input template file are used to define the access time between ports. Tests and cycles are generated for various combinations of simultaneous access, according to input parameters.

More in detail, at steps 701-702 Verilog tasks are generated with regard to simultaneous functional access test cases and corresponding calls, while at steps 703-704, the same kind of data is generated with regard to timing.

Figure 14:
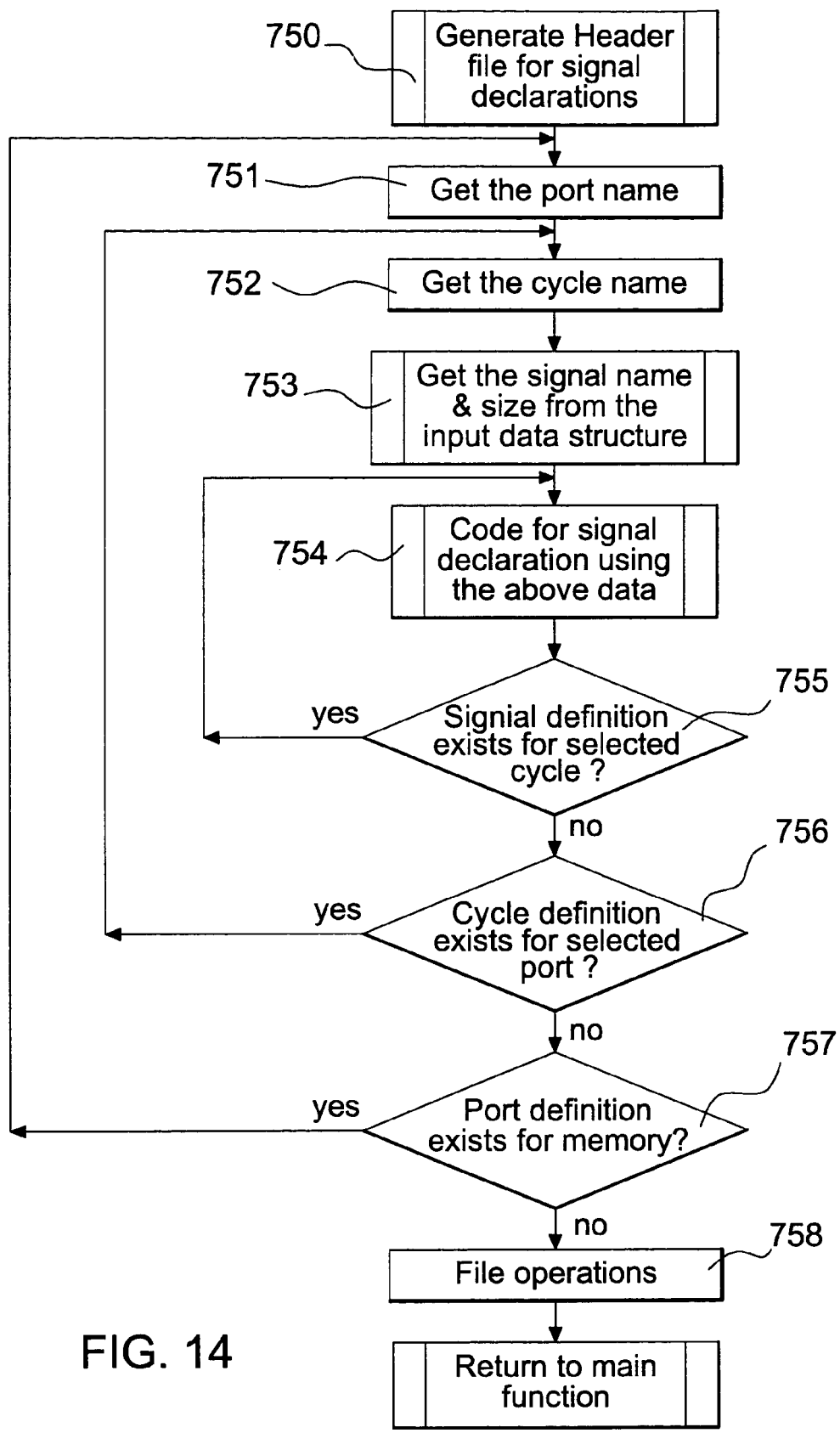
FIG. 14 is a data flow diagram showing an algorithm for the generation of a header file.

Algorithm 750, shown in FIG. 14, generates a header file which provides all variable declarations and file handling through one common point.

At step 751 a port name is read, and a cycle name is read at step 752, followed by a signal name and structure taken from input data structure (step 753).

Starting from this data, Verilog code for signal declaration is generated at step 754.

At step 755 it is checked whether a further signal definition exists for the selected cycle, in which case the flow loops back to step 754.

At step 756 it is checked whether a further cycle definition exists for the selected port, in which case the flow loops back to step 752.

At step 757 it is checked whether a further port definition exists for the memory in issue, in which case the flow loops back to step 751.

Finally, at step 758, file operations are performed to write data to output files and then closing open files.

The following block shows the basic structure of a header file generated according to algorithm 750.

```
            // time scale declaration for the simulations.
            time . . .
            // input / output variable identification for the
            // memory
            output . . .
            input . . .
            // module declaration.
            module . . .
            // memory model instantiation.
                <memory model name> <instance name> <signal
            declarations>;
            // variables declarations.
            reg     . . .
            wire    . . .
            integer . . .
            // file operations. Declarations so as the
      simulation
            // results can be written onto output files
            $fopens (. . .)
            // end of module declaration.
            end module
```

It has been shown that the present invention achieves the proposed aim and objects, providing designers of integrated circuits with a system and method that allow to generate comprehensive test benches in an easy and automatic manner.

A preferred embodiment has been detailed with regard to memory designing. Clearly, several modifications will be apparent to and can be readily made by the skilled in the art without departing from the scope of the present invention. Therefore, the scope of the claims shall not be limited by the illustrations or the preferred embodiments given in the description in the form of examples, but rather the claims shall encompass all of the features of patentable novelty that reside in the present invention, including all the features that would be treated as equivalents by the skilled in the art.

What is claimed is:

1. A computer based test bench generator for an integrated circuit memory model, comprising:
    a repository storing an identification of memory models catalogued according to memory type, number of ports and synchronous/asynchronous functional operation along with a test type associated with each such memory model;
    means for entering behavior data of a memory model under test, the behavior data comprising an identification of ports in the memory model under test and a description for each such port of port cycles and port behavior;
    means for entering configuration data of the memory model under test;
    means for automatically generating test benches, said means being configured to select the test type from the repository based on a match between the entered configuration data of the memory model under test and the catalogued memory models from said repository and further execute a software-based test case file generation algorithm which generates, according to the entered configuration and behavior data, specific test vectors for the selected test type for uniquely testing the memory model under test.

2. The test bench generator of claim 1, wherein said test benches are specified in a Hardware Description Language.

3. The test bench generator of claim 1, wherein said behavior data is specified in a proprietary language.

4. The test bench generator of claim 1, wherein said configuration data is input to said means for generating through a command line.

5. The test bench generator of claim 1, wherein said selection of the test type is based on conditional statements.

6. A method for verifying integrated circuits specified by integrated circuit memory models, comprising the steps of:
storing an identification of memory models catalogued according to memory type, number of ports and synchronous/asynchronous functional operation in a repository along with a test type associated with each memory model;
entering behavior data of a memory model under test, the behavior data comprising an identification of ports in the memory model under test and a description for each such port of port cycles and port behavior;
entering configuration data of the memory model under test;
selecting the test type based on a match between the entered configuration data of the memory model under test and the catalogued memory models from said repository;
executing a software-based test case file generation algorithm which generates, according to the configuration and behavior data, specific test vectors for the selected test type for uniquely testing the memory model under test, so as to generate test benches; and
applying the generated test benches on a simulator to verify the memory model under test.

7. The method according to claim 6, wherein said test benches are specified in a Hardware Description Language.

8. The method according to claim 6, wherein said behavior data is specified in a proprietary language.

9. The method according to claim 6, wherein said configuration data is input through a command line.

10. The method according to claim 6, wherein said selection of the test type is based on conditional statements.

11. A test bench generator for integrated circuit designs, comprising:
a repository which stores functional and structural characteristic data for integrated circuit models alone with a test associated with each circuit model;
a processing functionality which receives an identification of a specific integrated circuit model to be tested along with model data describing the configuration and behavior of that specific integrated circuit model, the processing functionality operating to:
process the model data in view of the identified specific integrated circuit model to produce a configured integrated circuit model suitable for simulation;
compare the specific integrated circuit model to characteristic data in the repository to identify tests applicable to that specific integrated circuit model; and
execute a software-based test case file generation algorithm which generates, in accordance with received model data, specific test vectors for each of the identified applicable tests for uniquely testing the configured integrated circuit model.

12. The generator of claim 11 wherein the specific test vectors comprise a set of self-checking test benches for the specific integrated circuit model.

13. The generator of claim 12 wherein the self-checking test benches include self-checking models incorporating complex constructs for comparing data, waiting for internal events, and timing constraint checking with respect to the specific integrated circuit model.

14. The generator of claim 11 wherein the received specific integrated circuit model to be tested is specified using a hardware description language.

15. The generator of claim 11 further including a simulator functionality which applies the identified applicable tests against the configured integrated circuit model.

16. A test bench generation method for integrated circuit designs, comprising:
storing functional and structural characteristic data for integrated circuit models along with a test associated with each circuit model;
receiving an identification of a specific integrated circuit model to be tested along with model data describing the configuration and behavior of that specific integrated circuit model;
processing the model data in view of the identified specific integrated circuit model to produce a configured integrated circuit model suitable for simulation;
comparing the specific integrated circuit model to stored characteristic data to identify tests applicable to that specific integrated circuit model; and
executing a software-based test case file generation algorithm which generates, in accordance with received model data, specific test vectors for each of the identified applicable tests for uniquely testing the configured integrated circuit model.

17. The method of claim 16 wherein the test vectors are a set of self-checking test benches for the specific integrated circuit model.

18. The method of claim 17 wherein the self-checking test benches include self-checking models incorporating complex constructs for comparing data, waiting for internal events, and timing constraint checking with respect to the specific integrated circuit model.

19. The method of claim 16 wherein the received specific integrated circuit model to be tested is specified using a hardware description language.

20. The method of claim 16 further including applying the identified applicable tests against the configured integrated circuit model to simulate operation.

* * * * *